(12) United States Patent
Kern et al.

(10) Patent No.: US 9,582,354 B2
(45) Date of Patent: Feb. 28, 2017

(54) APPARATUS AND METHOD FOR IMPROVING DATA STORAGE BY DATA INVERSION

(71) Applicant: Infineon Technologies AG, Neubiberg (DE)

(72) Inventors: Thomas Kern, Munich (DE); Karl Hofmann, Munich (DE); Michael Goessel, Mahlow (DE)

(73) Assignee: Infineon Technologies AG, Neubiberg (DE)

( * ) Notice: Subject to any disclaimer, the term of this patent is extended or adjusted under 35 U.S.C. 154(b) by 57 days.

(21) Appl. No.: 14/166,360

(22) Filed: Jan. 28, 2014

(65) Prior Publication Data

US 2015/0212877 A1 Jul. 30, 2015

(51) Int. Cl.
*G11C 29/00* (2006.01)
*G06F 11/10* (2006.01)
(Continued)

(52) U.S. Cl.
CPC ...... *G06F 11/1008* (2013.01); *G06F 11/1012* (2013.01); *G11C 7/1006* (2013.01);
(Continued)

(58) Field of Classification Search
CPC G06F 11/1008; G06F 11/1012; H03M 13/00; G11C 7/1006; G11C 11/1675;
(Continued)

(56) References Cited

U.S. PATENT DOCUMENTS

| 7,249,296 B2 | 7/2007 | Hirabayashi |
| 7,437,653 B2 | 10/2008 | Gorobets |

(Continued)

FOREIGN PATENT DOCUMENTS

| JP | 2000163273 A | 6/2000 |
| JP | 2011518369 A | 6/2011 |

(Continued)

OTHER PUBLICATIONS

Lin, et al. "Error Control Coding: Fundamentals and Applications." ISBN #: 0-13-283796-X. Published in 1983. p. 149.
(Continued)

*Primary Examiner* — April Y Blair
*Assistant Examiner* — Thien D Nguyen
(74) *Attorney, Agent, or Firm* — Eschweiler & Potashnik, LLC

(57) ABSTRACT

An apparatus includes a processing unit and a memory. The processing unit is configured to encode a plurality of bits to obtain a plurality of encoded bits, the processing unit is configured to determine an inversion decision. When the inversion decision indicates that the subset of the encoded bits shall not be inverted, the processing unit is configured to store, as a stored word, bits of the first codeword into the memory. When the inversion decision indicates that the subset of the encoded bits shall be inverted, the processing unit is configured to invert each encoded bit of a subset of the encoded bits to obtain a second codeword and to store the second codeword into the memory.

20 Claims, 5 Drawing Sheets

(51) Int. Cl.
  *G11C 11/16* (2006.01)
  *G11C 13/00* (2006.01)
  *G11C 16/06* (2006.01)
  *G11C 29/02* (2006.01)
  *G11C 7/10* (2006.01)
  *H03M 13/00* (2006.01)
  *G11C 29/04* (2006.01)

(52) U.S. Cl.
  CPC ........ *G11C 11/165* (2013.01); *G11C 11/1675* (2013.01); *G11C 13/0021* (2013.01); *G11C 16/06* (2013.01); *G11C 29/025* (2013.01); *H03M 13/00* (2013.01); *G11C 13/0069* (2013.01); *G11C 2029/0411* (2013.01)

(58) Field of Classification Search
  CPC ..... G11C 16/06; G11C 29/025; G11C 11/165; G11C 13/0021; G11C 2029/0411; G11C 13/0069
  See application file for complete search history.

(56) References Cited

U.S. PATENT DOCUMENTS

| | | | |
|---|---|---|---|
| 8,645,802 B2 | 2/2014 | Obata et al. | |
| 8,963,684 B2 | 2/2015 | Nyffeler et al. | |
| 9,106,263 B2 | 8/2015 | Yamamoto et al. | |
| 2004/0210814 A1* | 10/2004 | Cargnoni | H03M 13/13 714/758 |
| 2008/0133999 A1* | 6/2008 | Kondo | H03M 13/1105 714/755 |
| 2009/0097345 A1* | 4/2009 | Kushnarenko | G11C 29/1201 365/201 |
| 2010/0241927 A1 | 9/2010 | Soma | |
| 2011/0283166 A1 | 11/2011 | Kim et al. | |
| 2013/0124943 A1 | 5/2013 | Mateescu et al. | |
| 2013/0283121 A1* | 10/2013 | Laurent | G06F 11/1068 714/755 |
| 2014/0095956 A1* | 4/2014 | Ozdemir | G06F 11/1048 714/755 |

FOREIGN PATENT DOCUMENTS

| | | |
|---|---|---|
| JP | 2012124623 A | 6/2012 |
| JP | 2012129591 A | 7/2012 |
| JP | 2013198128 A | 9/2013 |
| WO | 0109902 A1 | 2/2001 |

OTHER PUBLICATIONS

Fujiwara, Hidehiro et al. "A Novel Two-Port SRAM for Low Bitline Power Using Majority Logic and Data-Bit Reordering." IEICE Technical Report. vol, 107. No. 1. pp. 35-40, ICD2007-7.

Aymen, Fradi et al. "A New Efficent Self-Checking Hsiao SEC-DED Memory Eror Correcting Code." Microelectronics (ICM). 2011. International Conference. pp. 1-5.

Chang You-Sung et al. "Conforming Block Inversion for Low Power Memory." Very Large Scale Integration (VLSI) Systems, IEEE Transactions, vol. 10. No. 1. pp. 15-19, pub date Feb. 2002.

Tawada Masashi et al. "A Non-Volatile Memory Writing Reduction Method Based on State Encoding Limiting Maximum Hamming Distance." IEICE Technical Report. vol. 113, No. 120. pp. 95-100. MSS2013-18.

\* cited by examiner

APPARATUS AND METHOD FOR IMPROVING DATA STORAGE BY DATA INVERSION

FIELD

The present disclosure relates to an apparatus and a method for improving data storage by data inversion.

BACKGROUND

It would be highly beneficial if improved concepts for multi-bit correction would be provided.

It becomes increasingly important to increase the reliability of memories and also to reduce power consumption in the new arising types memories.

A lot of types of memories, for example MRAM (Magnetoresistive Random Access Memory), R-RAM (Resistive Random Access Memory), exhibit an asymmetrical behavior with respect to permanent faults and errors. For example, a lot of memories exhibit in general more stuck-at-0 memory faults than stuck-at-1 memory faults. Other memories exhibit in general more stuck-at-1 memory faults than stuck-at-0 memory faults.

For example, flash-memories are asymmetrical with respect to power consumption for writing 1 or 0. In other words, power consumption differs, when a 1 is written into memory compared to when a 0 is written into memory. In R-RAMs errors are unidirectional, mainly, stuck-at-zero errors occur, but not stuck-at-one errors. Also, regarding MRAMs, mainly stuck-at-0 faults occur, but not stuck-at-1 faults.

It would be highly appreciated, if improved concepts for data storage would be provided.

SUMMARY

An apparatus comprising a processing unit and a memory is provided. The processing unit is configured to encode a plurality of bits to obtain a plurality of encoded bits, and the processing unit is further configured to determine an inversion decision. When the inversion decision indicates that the subset of the encoded bits shall not be inverted, the processing unit is configured to store, as a stored word, bits of the first codeword into the memory. When the inversion decision indicates that the subset of the encoded bits shall be inverted, the processing unit is configured to invert each encoded bit of a subset of the encoded bits to obtain a second codeword and to store the second codeword into the memory.

An apparatus is provided. The apparatus comprises a processing unit, and a memory. The processing unit is configured to encode a plurality of bits to obtain a plurality of encoded bits by employing a linear error correcting code, wherein each of the plurality of encoded bits has a bit value, wherein the error correcting code has a code distance which is at least 3, and wherein the plurality of encoded bits forms a first codeword of the linear error correcting code. Moreover, the processing unit is configured to determine an inversion decision indicating whether a subset of the encoded bits shall be inverted or not depending on the subset of the encoded bits, wherein the subset of the encoded bits is determined such that the first codeword of the error correcting code is transformed into a second codeword of that code if all bits of the subset are inverted and wherein the subset comprises all encoded bits of the plurality of encoded bits or comprises at least three of the encoded bits of the plurality of encoded bits, and wherein an encoded bit of the subset of the encoded bits is an indication bit, wherein the bit value of the indication bit is equal to a first predefined bit value. When the inversion decision indicates that the subset of the encoded bits shall not be inverted, the processing unit is configured to store, as a stored word, bits of the first codeword into the memory, wherein the bits of the first codeword stored in the memory comprise the indication bit having the first predefined bit value. When the inversion decision indicates that the subset of the encoded bits shall be inverted, the processing unit is configured to modify the first codeword of the linear error correcting code to obtain the second codeword of the linear error correcting code by inverting each encoded bit of the subset of the encoded bits by changing its bit value, and is configured to store as the stored word the second codeword into the memory, wherein the second codeword comprises the indication bit being inverted so that the bit value of the indication bit is equal to a second predefined bit value being different from the first predefined bit value.

Moreover, another embodiment is provided. The apparatus comprises a processing unit, and a memory. In such another embodiment the processing unit is configured to supplement payload data bits $x_1, \ldots, x_n$ to be stored at an address a in an addressable memory by $l$ bits $bf_1, \ldots, bf_l$ with constant values, wherein $l \geq 1$.

The processing unit is configured to encode the bits with constant values $bf_1, \ldots, bf_l$ and the payload data bits $x_1, \ldots, x_n$ with a linear code C correcting at least 1-bit errors into a codeword $c_1, \ldots, c_m, bf_1, \ldots, bf_l, x_1, \ldots, x_n$, wherein $c_1, \ldots, c_m$ are check bits determined from $bf_1, \ldots, bf_l$, $x_1, \ldots, x_n$ when bits derived from the address bits are not involved in forming a codeword, and coding of bits $bf_1, \ldots, bf_l, x_1, \ldots, x_n, A_1, \ldots, A_k$ With a linear code C correcting at least 1-bit errors into a codeword $c_1, \ldots, c_m$, $bf_1, \ldots, bf_l, x_1, \ldots, x_n, A_1, \ldots, A_k$, wherein $c_1, \ldots, c_m$ are check bits determined from $bf_1, \ldots, bf_l, x_1, \ldots, x_n$, $A_1, \ldots, A_k$, when bits $A_1, \ldots, A_k$ derived from the address bits $a_1, \ldots, a_r$ are involved in encoding, and $A_1, \ldots, A_k = f$ $(a_1, \ldots, a_r)$ are determined by a function $f: 0,1^r \to \{0,1\}^k$ from the address bits.

Moreover, the processing unit is configured to define K groups $Y_1, \ldots, Y_k$ Of bits of the bits $c_1, \ldots, c_m$, $bf_1, \ldots, bf_l, x_1, \ldots, x_n$ to be stored directly or invertedly so that a subset of defined bits $bf_1, \ldots, bf_l$ is uniquely allocated to each of these groups, wherein $K \geq 1$.

Furthermore, the processing unit is configured to select which group of bits of groups $Y_1, \ldots, Y_k$ is stored into the memory in an inverted or non-inverter manner.

The processing unit is configured to write the bits $c_1, \ldots, c_m, bf_1, \ldots, bf_l, x_1, \ldots, x_n$ into the memory at an address a, wherein bits belonging to a group of bits written into the memory invertedly are inverted prior to writing, and the bits not belonging to a group whose bits are inverted are written into the memory in a non-inverted manner, Moreover, the processing unit is configured to read out the bits stored in the memory at an address a.

If the bits derived from the address bits are not involved in forming the codeword, the processing unit is configured to correct, based on the error correcting code C, bits read out from the memory possibly differing from values written to the same address due to an error, at least at the bit positions at which the constant values $bf_1, \ldots, bf_l$ have been stored directly or invertedly.

If the bits derived from the address bits are involved in forming the codeword, the processing unit is configured to correct, based on the error correcting code C, possibly erroneous values read out from the memory and by using possibly also erroneous bits $A_1', \ldots, A_k'$ derived from the possibly erroneous address bits at least at the bit positions at which the constant values $bf_1, \ldots, bf_l$ have been stored directly or invertedly.

The processing unit is configured to determine from the read-out constant values corrected by using the code C and uniquely allocated to the respective bit groups, whether and which bit group has been written into the memory directly or invertedly.

The processing unit is configured to invert the read-out and corrected bits of the bit group that has been determined in the previous step as the bit groups whose bits have been inverted during writing.

In an embodiment, k=r and $(A_1, \ldots, A_k)=(a_1, \ldots, a_r)$ apply.

According to an embodiment, k=1, $A_1=f(a_1, \ldots, a_r)=a_1+a_2+\ldots+a_r$ applies, and $A_1$ is the parity of the address bits $a_1, \ldots, a_r$.

Moreover, a further embodiment is provided for directly or invertedly writing a subset of bits forming a codeword of a linear code C correcting at least 1-bit errors into a memory of memory cells directly or invertedly, and for reading and recovering the bits written into the memory from the bits read out possibly erroneously from the memory that were stored directly or invertedly. The apparatus comprises a processing unit, and a memory.

In such a further embodiment, the processing unit is configured to define the number K of subsets of the bits encoded with a linear code C correcting at least 1-bit errors that can be written into the memory directly or invertedly, wherein K≥1.

The processing unit is configured to provide n payload data bits $x_1, \ldots, x_n$ that are to be stored as a subword of a codeword of a linear systematic code correcting at least 1-bit errors at an address $a=a_1, \ldots, a_r$ with r≥2, The processing unit is configured to form the information bits $u_1, \ldots, u_N$ of the code C, wherein then, if the address a is not involved in forming the codewords of the code C, the databits $x_1, \ldots, x_n$ are supplemented by l defined binary values $bf_1, \ldots, bf_l$, so that $$u_1, \ldots, u_N = bf_1, \ldots, bf_l, x_1, \ldots, x_n$$

with N=l+n applies, and if the address a is involved in forming the codewords of the code C, the data bits $x_1, \ldots, x_n$ and bits $A_1, \ldots, A_k$ derived from address bits $a_1, \ldots, a_r$ are supplemented by l defined binary values $bf_1, \ldots, bf_l$, so that $$u_1, \ldots, u_N = bf_1, \ldots, bf_l, x_1, \ldots, x_n, A_1, \ldots, A_k$$

with N=l+n+k applies, wherein $$A_1, \ldots, A_k = f(a_1, \ldots, a_r)$$

are binary values uniquely determined by a function f from the values of the r address bits $a_1, \ldots, a_r$, l≥1 and 1≤k≤r, wherein, if the address bits are not involved in error detection or error correction, the processing unit is configured to form a codeword $y, \ldots, y_P$ of the code C, wherein C is a linear systematic code with a generator matrix G in systematic form and an H-matrix H, wherein $$y = y_1, \ldots, y_P = (u_1, \ldots, u_N) G \cdot = c_1, \ldots, c_m, bf_1, \ldots, bf_l, x_1, \ldots, x_n,$$

applies and $c_1, \ldots, c_m$ m are check bits, the generator matrix G is an (N,P)-matrix and the H-matrix $H=(h_1, \ldots, h_P)$ is an ([P−N],P)-matrix, so that all columns of the H-matrix are pairwise distinct and unequal to 0 and m=P−N and N=n+l applies, wherein the processing unit is configured to determine K subsets $Y_1=\{y_{1,1}, \ldots, y_{1,q1}\}, \ldots, Y_K=\{y_{K,1}, \ldots, y_{K,qK}\}$ of bits $$y_1, \ldots, y_P = c_1, \ldots, c_m, bf_1, \ldots, bf_l, x_1, \ldots, x_n,$$

so that a subset of bits $bf_1, \ldots, bf_l$ is uniquely allocated to each subset $Y_1, \ldots, Y_k$, so that if $y_1^b, \ldots, y_P^b$ are binary values of the bits $y_1, \ldots, y_P$, then $y_1^b, \ldots, y_P^b$ is the codeword of the code C when for k=1, ..., K and for j=1, ..., P, if $y_j$ is an element of the subset $Y_k$, then $y_1^b=1$ and if $y_j$ is no element of subset $Y_k$, then $y_1^b=0$, so that $$H \cdot (y_1^b, y_2^b, \ldots, y_P^b) = 0$$

applies and H is the H-matrix of the code C, wherein the processing unit is configured to define which group of groups of bits $Y_1, \ldots, Y_k$ is written into the memory directly or invertedly, wherein the processing unit is configured to form the P bits $d_1, \ldots, d_P$ to be written into the memory, wherein for 1, ... P, $d_i = \overline{y_i}$ when $y_i$ belongs to the group whose bits are written into the memory invertedly, and $d_i = y_i$ when $y_i$ does not belong to any group whose bits are written into the memory invertedly, wherein the processing unit is configured to write the bits $d_1, \ldots, d_P$ into the memory at an address a, wherein the processing unit is configured to create an address a and to read out the possibly erroneous values $d'_1, \ldots, d'_P$, stored at the address a, which have originated from the values $d_1, \ldots, d_P$ written at the address a by possible errors, wherein the processing unit is configured to define L bit positions $k_1, \ldots, k_L$ to be corrected by code C with l≤P and $\{k_1, \ldots, k_L\} \subseteq \{1, \ldots, P\}$, that are to be corrected by using the code C in the case of an erroneous value, wherein the bit positions at which $bf_1, \ldots, bf_l$ have been stored directly or invertedly belong to the bit positions to be corrected, wherein the processing unit is configured to determine binary correction values $e_{k_1}, \ldots, e_{k_L}$ of the defined L bit positions $k_1, \ldots, k_L$ to be corrected based on the code C for errors correctable by the code C, wherein the processing unit is configured to form corrected bits $$d_{k_i}^{cor} = d'_{k_i} op\, e_{k_i}$$

at least at the bit positions at which values $bf_1, \ldots, bf_l$ have been stored directly or invertedly, wherein op is a uniquely invertible Boolean operation, wherein the processing unit is configured to determine, based on the known inserted values $bf_1, \ldots, bf_l$ and the respective read-out values corrected by using the code C, for which group $Y_1, \ldots, Y_k$ the bits have been stored directly or invertedly, wherein the processing unit is configured to output the bits $$y_{k_i}^{cor} = d'_{k_i} op\, e_{k_i}$$

if $y_{k_i}$ belongs to a group of bits whose bits have been written directly into the memory and outputting the bits $$y_{k_i}^{cor} = \overline{d'_{ki} op\, e_{k_i}}$$

if $y_{k_i}$ belongs to a group of bits that have been written into the memory invertedly during writing into the memory, wherein "op" is a two-ary uniquely invertible Boolean operation, wherein, if the address bits are involved in error detection and error correction, the processing unit is configured to form a codeword $y = y_1, \ldots, y_P$ of the code C, wherein C is a linear systematic code with a generator matrix G in systematic form and an H-matrix H, wherein $$y = y_1, \cdots, y_P$$
$$= (u_1, \cdots, u_N) \cdot G$$
$$= = c_1, \cdots, c_m, bf_1, \cdots, bf_l, x_1, \cdots, x_n, A_1, \cdots, A_k$$

applies, the generator matrix G is an (N,P)-matrix and the H-matrix H=($h_1, \ldots, h_P$) is an ([P−N],P)-matrix, so that all columns of the H-matrix are pairwise distinct and unequal to 0 and P=n+l+m+k and $c_1, \ldots, c_m$ are check bits, (N durch P ersetzt)

wherein the processing unit is configured to determine K subsets $Y_1=\{y_{1,1}, \ldots, y_{1,q1}\}, \ldots, Y_K=\{y_{K,1}, \ldots, y_{K,qK}\}$ of the bits $$y_1, \ldots, y_{n+l}, y_{n+l+k+1}, \ldots, y_P = c_1, \ldots,$$
$$c_m, bf_1, \ldots, bf_l, x_1, \ldots, x_n,$$

so that each bit of the bits $bf_1, \ldots, bf_l$, belongs to only one of the subsets $Y_1, \ldots, Y_K$, and so that If $y_1^b, \ldots, y_P^b$ are binary values of the bits $y_1, \ldots, y_P$, then $y_1^b, \ldots, y_P^b$ is a codeword of the code C if for k=1, . . . , K and for j=1, . . . , P, it applies that
if $y_j$ is an element of the subset $Y_k$, then $y_j^b$=1 and if $y_j$ is no element of the subset $Y_k$, then $y_j^b$=0, so that $$H \cdot (y_1^b, y_2^b, \ldots, y_P^b) = 0$$

applies and H is the H-matrix of code C, wherein the processing unit is configured to define which group of bits $Y_1, \ldots, Y_k$ are written into the memory directly or invertedly, wherein the processing unit is configured to form the P−k bits $d_1, \ldots, d_{m+l+n}$, to be written into the memory, wherein for i=1, . . . , m+n+l, $d_i = y_i$ when $y_i$ belongs to a group whose bits are written into the memory directly, and $d_i = \overline{y_i}$ when $y_i$ belongs to a group whose bits are written into the memory invertedly, wherein the processing unit is configured to write the bits $d_1, \ldots, d_{m+n+l}$ at an address a into the memory, wherein the processing unit is configured to create an address a and reading out possibly erroneous values $d'_1, \ldots, d'_{m+n+l}$ stored at the address a, which have originated from values $d_1, \ldots, d_{n+l}+d_{n+k+1}, \ldots, d_P$ written at the address a by possible errors, wherein the processing unit is configured to define L bit positions $k_1, \ldots, k_L$ to be corrected by code C with L≤P−k and $\{k_1, \ldots, k_L\} \subseteq \{1, \ldots, n+l, n+l+k+1, P\}$, that are corrected by using the code C in the case of an erroneous value, wherein the bit positions at which $bf_1, \ldots, bf_l$ have been stored directly or invertedly belong to the bit positions to be corrected, wherein the processing unit is configured to determine binary correction values $e_{k_1}, \ldots, e_{K_L}$ of the defined L bit positions $k_1, \ldots, k_L$ for errors correctable by the code C, wherein the processing unit is configured to form corrected bits $$d_{k_i}^{cor} = d'_{ki} op e_{k_i}$$

at least at the bit positions at which the values $bf_1, \ldots, bf_l$ have been stored directly or invertedly, wherein "op" is a binary clearly reversible operation, wherein the processing unit is configured to determine, based on the known inserted values $bf_1, \ldots, bf_l$ and the corresponding correct values read out and corrected by using the code C, for which group of the bits $Y_1, \ldots, Y_k$ the bits have been stored directly or invertedly, and wherein the processing unit is configured to output the bits $$y_{k_i}^{cor} = d'_{k_i} op e_{k_i}$$

if $y_{k_i}$ belongs to a group of bits whose bits have been written directly into the memory, and to output the bits $$y_{k_i}^{cor} = \overline{d'_{ki} op e_{k_i}}$$

if $y_{k_i}$ belongs to a group of bits that have been written into the memory invertedly during writing into the memory, wherein "op" is a two-ary uniquely invertible Boolean operation.

According to another embodiment, an apparatus for storing bits in a memory is provided, wherein the bits are encoded with a linear error correcting code C, the linear error correcting code C having a code distance which is at least 3, wherein it is determined whether a subset of the bits encoded with the linear error correcting code C is written into the memory directly or in a bit-by-bit inverted manner, and wherein the code C comprises an H-matrix H, wherein the apparatus comprises a processing unit, and a memory. A subset of bits written into the memory either directly or invertedly comprises at least one binary constant value, which is together with payload data bits used for coding for forming a codeword of the linear code C. The processing unit is configured to write the binary constant value as a binary value bf into the memory when the bits of the respective subset of bits are directly written into the memory. The processing unit is configured to write the binary constant value into the memory as an inverted value $\overline{bf}$ when the bits of the respective subset of bits are invertedly written into the memory.

The processing unit is configured to convert a codeword of the code C to a codeword of the same code when the subset of bits written into the memory either directly or invertedly is inverted and the H-matrix of the code is formed such that the number of ones of each component of the columns of the H-matrix corresponding to the subset of bits written into the memory either directly or invertedly, is even.

Moreover, the processing unit is configured to correct, when reading out from the memory, possibly erroneous bits read out from the memory by using the linear error correcting code C, wherein at least that bit at the bit position at which the constant binary value bf has been written is corrected when the respective subset of bits has been written into the memory directly, or at the bit position at which the constant binary value $\overline{bf}$ has been written, when the respective subset of bits has been written into the memory invertedly.

Furthermore, the processing unit is configured to invert bits of the subset of bits that have been written into the memory directly or invertedly after reading out when the corrected value that has been read out at the bit position at which the constant value bf or the inverted constant value $\overline{bf}$ has been stored is equal to $\overline{bf}$, and not inverted, when this value is equal to bf.

According to another embodiment, a method is provided. The method comprises:
Encoding a plurality of bits to obtain a plurality of encoded bits by employing a linear error correcting code, wherein each of the plurality of encoded bits has a bit value, wherein the error correcting code has a code distance which is at least 3, and wherein the plurality of encoded bits forms a first codeword of the linear error correcting code.

Determining an inversion decision indicating whether a subset of the encoded bits shall be inverted or not depending on the subset of the encoded bits, wherein the subset of the encoded bits is determined such that the first codeword of the error correcting code is transformed into a second codeword of that code if all bits of the subset are inverted and wherein the subset comprises all encoded bits of the plurality of encoded bits or comprises at least three of the encoded bits of the plurality of encoded bits, and wherein an encoded bit of the subset of the encoded bits is an indication bit, wherein the bit value of the indication bit is equal to a first predefined bit value.

When the inversion decision indicates that the subset of the encoded bits shall not be inverted, storing, as a stored word, bits of the first codeword into the memory, wherein the bits of the first codeword stored in the memory comprise the indication bit having the first predefined bit value.

When the inversion decision indicates that the subset of the encoded bits shall be inverted, modifying the first codeword of the linear error correcting code to obtain the second codeword of the linear error correcting code by inverting each encoded bit of the subset of the encoded bits by changing its bit value, and storing as the stored word the second codeword into the memory, wherein the second codeword comprises the indication bit being inverted so that the bit value of the indication bit is equal to a second predefined bit value being different from the first predefined bit value.

Embodiments are based on the finding that data inversion may be employed for data storage. According to embodiments, data inversion allows to mask permanent faults. This is especially useful when the error rate is relatively high when a memory is relatively new.

If a stuck-at-0 fault occurs at a data location, no error occurs if the bit to be stored at this location is 0. But an error occurs if the bit to be stored is 1. If the bit to be stored is 1, for the inverted data the bit to be stored at this location is 0 and no error occurs, if the bit is stored invertedly.

According to embodiments, if there are several stuck-at faults, it is very useful to invert or not to invert different groups of data in a dataword separately. By this, the stored data can be adapted to the occurring faults by inverting groups of data.

Moreover, data inversion allows to reduce power consumption, for example, if storing a 1 requires more energy than storing a zero, or vice versa.

For example, if an erased state is denoted by 1, for writing a 0 much more energy may be needed than for writing a 1. Or, for example, if the number of 0th in a data word is greater than the number of 1th it is useful to invert the data before storing.

According to embodiments, a better adaption can be achieved if the data is inverted in a groupwise way.

According to embodiments, data inversion is employed to reduce the error rate. If errors occur unidirectionally, for example, a 1 to be stored is changed to 0, e.g., by a stuck-at-0 fault, the bits which are equal to 0 will not be changed to an error state.

If the number of 1s in a data word is greater than the number of 0s, it is useful to invert the data before storing, when more stuck-at-0 faults are present than stuck-at-1 faults. Then, after inversion, the number of 0s is greater than the number of 1s and the number of possible errors is reduced.

A better adaption can be achieved if the data are inverted in a groupwise way.

According to embodiments, a "fixbit" is added to the data bits. The data bits and the fixbit are jointly used as information bits of an error correcting linear code C, and the check bits are determined from the information bits, i.e. the data bits and the fixbit.

According to embodiments, the code C is chosen such that if a word w is a codeword, the inverted codeword $\overline{w}$ is also a codeword. In embodiments, the codeword is directly or invertedly stored.

According to embodiments, if an erroneous bit occurred, also the fix-bit is corrected using the error correcting code C. After correction, the corrected fixbit indicates whether or not the data stored in the memory are to be inverted. According to embodiments, the fix-bit is corrected by the same linear code C, by which the data bits and the check bits are also corrected.

In embodiments, groups or subsets of bits of a codeword are inverted. Fixbits, indicating a group is inverted or not, are assigned to every subgroup. All these fixbits are part of the information bits for determining the check-bits.

According to embodiments, the subgroups are selected such that the inversion of the bits of a subgroup transforms a codeword of the code C into a codeword of C.

In some embodiments, address bits are part of the codeword but are not stored, and address bits are not inverted.

According to embodiments, fix-bits (inversion-flag-bits) are part of the error correction by the linear code.

In some embodiments, subgroups of bits are inverted.

According to embodiments, the code is selected such that the inversion of the bits of a subgroup transforms a codeword into a codeword.

In some embodiments, addresses are included in the determination of the checkbits, but are not inverted.

Before embodiments are described in detail using the accompanying figures, it is to be pointed out that the same or functionally equal elements are given the same reference numbers in the figures and that a repeated description for elements provided with the same reference numbers is omitted. Hence, descriptions provided for elements having the same reference numbers are mutually exchangeable.

DETAILED DESCRIPTION

An apparatus comprising a processing unit and a memory is provided. The processing unit is configured to encode a plurality of bits to obtain a plurality of encoded bits, the processing unit is configured to determine an inversion decision. When the inversion decision indicates that the subset of the encoded bits shall not be inverted, the processing unit is configured to store, as a stored word, bits of the first codeword into the memory. When the inversion decision indicates that the subset of the encoded bits shall be inverted, the processing unit is configured to invert each encoded bit of a subset of the encoded bits of the first codeword to obtain a second codeword and to store the second codeword into the memory.

Figure 1:
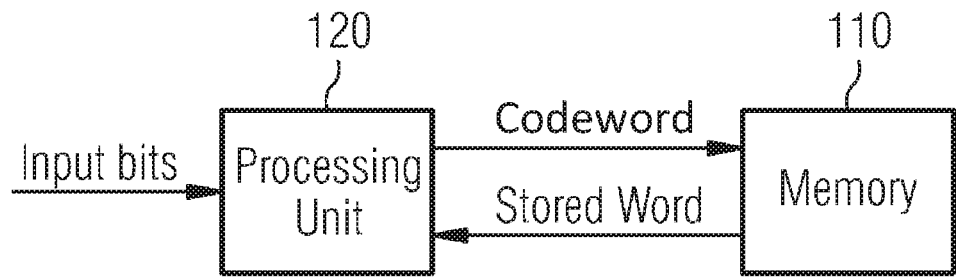
FIG. 1 illustrates an apparatus according to an embodiment.

FIG. 1 illustrates an apparatus according to an embodiment. The apparatus comprises a processing unit 120, and a memory 110. The processing unit 120 is configured to encode a plurality of bits to obtain a plurality of encoded bits by employing a linear error correcting code, wherein each of the plurality of encoded bits has a bit value, wherein the error correcting code has a code distance which is at least 3, and wherein the plurality of encoded bits forms a first codeword of the linear error correcting code. Moreover, the processing unit 120 is configured to determine an inversion decision indicating whether a subset of the encoded bits shall be inverted or not depending on the subset of the encoded bits, wherein the subset of the encoded bits is determined such that the first codeword of the error correcting code is transformed into a second codeword of that code if all bits of the subset are inverted and wherein the subset comprises all encoded bits of the plurality of encoded bits or comprises at least three of the encoded bits of the plurality of encoded bits, and wherein an encoded bit of the subset of the encoded bits is an indication bit, wherein the bit value of the indication bit is equal to a first predefined bit value. When the inversion decision indicates that the subset of the encoded bits shall not be inverted, the processing unit 120 is configured to store, as a stored word, bits of the first codeword into the memory 110, wherein the bits of the first codeword stored in the memory 110 comprise the indication bit having the first predefined bit value. When the inversion decision indicates that the subset of the encoded bits shall be inverted, the processing unit 120 is configured to modify the first codeword of the linear error correcting code to obtain the second codeword of the linear error correcting code by inverting each encoded bit of the subset of the encoded bits by changing its bit value, and is configured to store as the stored word the second codeword into the memory 110, wherein the second codeword comprises the indication bit being inverted so that the bit value of the indication bit is equal to a second predefined bit value being different from the first predefined bit value.

As stated above, the plurality of encoded bits forms a first codeword of the linear error correcting code. This means that the encoded bits of the plurality of all the encoded bits form a first codeword of the error correcting code.

In an embodiment, the processing unit may, for example, be configured to generate a decision signal as the inversion decision, wherein the decision signal may, e.g., indicate whether a subset of the encoded bits shall be inverted or not.

According to an embodiment, the apparatus may be a circuitry.

In an embodiment, the subset of the encoded bits comprises all encoded bits of the plurality of encoded bits.

According to an embodiment, the subset of the encoded bits does not comprise all encoded bits of the plurality of encoded bits.

In an embodiment, the error correcting code is a linear error correcting code C, wherein the first predefined value is a first constant binary value bf, wherein the second predefined value is a second constant binary value $\overline{bf}$, wherein the processing unit 120 is configured to read the stored word from the memory 110, and wherein the processing unit 120 is configured to invert bits of the subset of bits that have been written into the memory 110 directly or invertedly, after reading out the stored word, when a bit value that has been read out from a bit position in the memory 110, at which the indication bit has been stored, is equal to the second constant binary value $\overline{bf}$, and is configured to not invert, when the bit value that has been read out from the bit position in the memory 110, at which the indication bit has been stored, is equal to the first constant binary value bf.

According to an embodiment, the error correcting code is a linear error correcting code C, wherein the first predefined value is a first constant binary value bf, wherein the second predefined value is a second constant binary value $\overline{bf}$, and wherein the processing unit 120 is configured to read out the stored word from the memory 110, wherein the processing unit 120 is configured to correct one or more bits of the stored word, if the one or more bits are erroneous, by using the linear error correcting code C, wherein at least a bit that has been stored at the bit position at which the indication bit has been written is corrected, if said bit is erroneous, and wherein, after reading out the stored word and after correcting the one or more bits, the processing unit 120 is configured to invert bits of the subset of bits that have been written into the memory 110 directly or invertedly, when a bit value that has been read out from a bit position in the memory 110, at which the indication bit has been stored, is equal to the second constant binary value $\overline{bf}$, and is configured to not invert, when the bit value that has been read out from the bit position in the memory 110, at which the indication bit has been stored, is equal to the first constant binary value bf.

In an embodiment, the linear error correcting code C comprises a parity check matrix H, wherein the number of ones of each component of the columns of the parity check matrix H is even.

According to an embodiment, the memory 110 is a register, or a register array, or an addressable memory 110.

In an embodiment, the memory is an addressable memory and the processing unit 120 is configured to encode the plurality of bits to obtain the plurality of encoded bits by employing the linear error correcting code, and by using address bits.

According to an embodiment, the processing unit 120 is configured to determine the inversion decision depending on the number of zeros of the subset of the encoded bits or the number of ones of the subset of the encoded bits.

In an embodiment, when after writing write values into the memory, after subsequently reading out the write values from the memory to obtain read values, and after comparing the write values and read values, no error has occurred, the processing unit is configured to determine the inversion decision so that the inversion decision indicates that the subset of encoded bits shall not be inverted.

In an embodiment, when after writing write values into the memory, after subsequently reading out the write values from the memory to obtain read values, and after comparing the write values and read values, a number of T errors have occurred at the most wherein T is smaller than or equal to the number of errors that can be corrected by the linear error correcting code, the processing unit is configured to determine the inversion decision so that the inversion decision indicates that the subset of encoded bits shall not be inverted.

In an embodiment, when, after writing inverted write values of a subset of bits into the memory 110, after subsequently reading out the written inverted write values from the memory 110 to obtain read values, and after comparing the written inverted write values and the read values, so many errors have occurred at the most as have occurred after direct writing and comparison of the read-out values and the written values, the processing unit 120 is configured to determine the inversion decision so that the inversion decision indicates that the subset of the encoded bits shall be inverted.

According to an embodiment, when, after writing inverted write values of a subset of bits into the memory 110, after subsequently reading out the written inverted write values from the memory 110 to obtain read values, and after comparing the written inverted write values and the read values, T errors have occurred at the most, wherein T is smaller than the number of errors that can be corrected by the code C, the processing unit 120 is configured to determine the inversion decision so that the inversion decision indicates that the subset of the encoded bits shall be inverted.

In an embodiment, the memory 110 is a Flash memory 110.

According to another embodiment, the memory 110 is an M-RAM or wherein the memory 110 is an R-RAM.

In an embodiment, the error correcting code comprises a generator matrix, wherein the processing unit 120 is configured to encode the plurality of bits by using the generator matrix in its systematic form for encoding.

According to another embodiment, the code C is a Hamming code or a shortened Hamming code.

In an embodiment, the error correcting code is a Hsiao code or a shortened Hsiao code.

According to another embodiment, the code C is a BCH code or a shortened BCH code.

Moreover, another embodiment is provided. In such another embodiment, the processing unit 120 is configured to supplement payload-data bits $x_1, \ldots, x_n$ to be stored at an address a in an addressable memory 110 by l bits $bf_1, \ldots, bf_l$ with constant values, wherein $l \geq 1$.

The processing unit 120 is configured to encode the bits with constant values $bf_1, \ldots, bf_l$ and the payload data bits $x_1, \ldots, x_n$ with a linear code C correcting at least 1-bit errors into a codeword $c_1, \ldots, c_m, bf_1, \ldots, bf_l, x_1, \ldots, x_n$, wherein $c_1, \ldots, c_m$ are check bits determined from $bf_1, \ldots, bf_l, x_1, \ldots, x_n$ when bits derived from the address bits are not included in forming a codeword, and coding of bits $bf_1, \ldots, bf_l, x_1, \ldots, x_n, A_1, \ldots, A_k$ with a linear code C correcting at least 1-bit errors into a codeword $c_1, \ldots, c_m, bf_1, \ldots, bf_l, x_1, \ldots, x_n, A_1, \ldots, A_k$, wherein $c_1, \ldots, c_m$ are check bits determined from $bf_1, \ldots, bf_l, x_1, \ldots, x_n, A_1, \ldots, A_k$, when bits $A_1, \ldots, A_k$ derived from the address bits $a_1, \ldots, a_r$ are involved in encoding, and $A_1, \ldots, A_k = f(a_1, \ldots, a_r)$ are uniquely determined by a function $f: \{0,1\}^r \to \{0,1\}^k$ from the address bits.

Moreover, the processing unit 120 is configured to define K groups $Y_1, \ldots, Y_k$ of bits of the bits $c_1, \ldots, c_m, bf_1, \ldots, bf_l, x_1, \ldots, x_n$ to be stored directly or invertedly so that a subset of defined bits $bf_1, \ldots, bf_l$ is uniquely assigned to each of these groups, wherein $K \geq 1$.

The processing unit 120 is configured to determine the groups of bits $Y_1, \ldots, Y_K$ such that a first codeword of the linear Code C is transformed into a second codeword of the code C if all the bits of a group $Y_j, j=1, \ldots, K$, are inverted and wherein the processing unit is configured to select which group of bits of groups $Y_1, \ldots, Y_K$ is stored into the memory in an inverted or non-inverter manner.

The processing unit 120 is configured to write the bits $c_1, \ldots, c_m, bf_1, \ldots, bf_l, x_1, \ldots, x_n$ into the memory at an address a, wherein bits belonging to a group of bits written into the memory 110 invertedly are inverted prior to writing, and the bits not belonging to a group whose bits are inverted are written into the memory 110 in a non-inverted manner.

Moreover, the processing unit 120 is configured to read out the bits stored in the memory 110 at an address a.

If the bits derived from the address bits are not involved in forming the codeword, the processing unit 120 is configured to correct, based on the error correcting code C, bits read out from the memory 110 possibly differing from values written to the same address due to an error, at least at the bit positions at which the constant values $bf_1, \ldots, bf_l$ have been stored directly or invertedly.

If the bits derived from the address bits are involved in forming the codeword, the processing unit 120 is configured to correct, based on the error correcting code C, possibly erroneous values read out from the memory 110 and by using possibly also erroneous bits $A'_1, \ldots, A'_k$ derived from the possibly erroneous address bits at least at the bit positions at which the constant values $bf_1, \ldots, bf_l$ have been stored directly or invertedly.

The processing unit 120 is configured to determine from the read-out constant values corrected by using the code C uniquely assigned to the respective bit groups, whether and which bit group has been written into the memory directly or invertedly.

The processing unit 120 is configured to invert the read-out and corrected bits of the bit group that has been determined in the previous step as the bit groups whose bits have been inverted during writing.

In an embodiment, k=r and $(A_1, \ldots, A_k) = (a_1, \ldots, a_r)$ apply.

According to an embodiment, k=1, $A_1 = f(a_1, \ldots, a_r) = a_1 + a_2 + \ldots + a_r$ applies, and A is the parity of the address bits $a_1, \ldots, a_r$.

Moreover, a further embodiment is provided for directly or invertedly writing a subset of bits forming a codeword of a linear code C correcting at least 1-bit errors into a memory 110 of memory cells directly or invertedly, and for reading and recovering the bits written into the memory 110 from the bits read out possibly erroneously from the memory 110 that were stored directly or invertedly. In such a further embodiment, the processing unit 120 is configured to define the number K of subsets of the bits encoded with a linear code C correcting at least 1-bit errors that can be written into the memory 110 directly or invertedly, wherein $K \geq 1$.

The processing unit 120 is configured to provide n payload data bits $x_1, \ldots, x_n$ that are to be stored as a subword of a codeword of a linear systematic code correcting at least 1-bit errors at an address $a = a_1, \ldots, a_r$ with $r \geq 2$, The processing unit 120 is configured to form the information bits $u_1, \ldots, u_N$ of the code C, wherein then, if the address a is not involved in forming the codewords of the code C, the databits $x_1, \ldots, x_n$ are supplemented by l defined binary values $bf_1, \ldots, bf_l$, so that $$u_1, \ldots, u_N = bf_1, \ldots, bf_l, x_1, \ldots, x_n$$

with N=l+n applies, and if the address a is involved in forming the codewords of the code C, the data bits $x_1, \ldots, x_n$ and bits $A_1, \ldots, A_k$ derived from address bits $a_1, \ldots, a_r$ are supplemented by l defined binary values $bf_1, \ldots, bf_l$, so that $$u_1, \ldots, u_N = bf_1, \ldots, bf_l, x_1, \ldots, x_n, A_1, \ldots, A_k,$$

with N=l+n+k applies, wherein $$A_1, \ldots, A_k = f(a_1, \ldots, a_r)$$

are binary values uniquely determined by a function $f$ from the values of the r address bits $a_1, \ldots, a_r$, $l \geq 1$ and $1 \leq k \geq r$, wherein, If the address bits are not involved in error detection or error correction. the processing unit 120 is configured to form a codeword y, . . . , $y_P$ of the code C, wherein C is a linear systematic code with a generator matrix G in systematic form and an H-matrix H, wherein $$y = y_1, \ldots, y_P = (u_1, \ldots, u_N) G = c_1, \ldots, c_m, bf_1, \ldots, bf_l, x_1, \ldots, x_n,$$

applies and $c_1, \ldots, c_m$ m are check bits, the generator matrix G is an (N,P)-matrix and the H-matrix $H=(h_1, \ldots, h_P)$ is an ([P−N],P)-matrix, so that all columns of the H-matrix are pairwise distinct and unequal to 0 and m=P−N and N=n+l and P=n+m+l applies, wherein the processing unit 120 is configured to determine K subsets $$Y_1 = \{y_{1,1}, \ldots, y_{1,q1}\}, \ldots, Y_K = \{y_{K,1}, \ldots, y_{K,qK}\} \text{ of bits}$$

$$y_1, \ldots, y_N = c_1, \ldots, c_m, bf_1, \ldots, bf_l, x_1, \ldots, x_n,$$

so that a subset of bits $bf_1, \ldots, bf_l$ is clearly allocated to each subset $Y_1, \ldots, Y_k$,
so that if $y_1^b, \ldots, y_P^b$ are binary values of the bits $y_1, \ldots, y_P$, then $y_1^b, \ldots, y_P^b$ is the codeword of the code C when for k=1, . . . , K and for j=1, . . . , P, if $y_j$ is an element of the subset $Y_k$, then $y_1^b=1$ and if $y_j$ is no element of subset $Y_k$, then $y_1^b=0$, so that $$H \cdot (y_1^b, y_2^b, \ldots, y_P^b) = 0$$

applies and H is the H-matrix of the code C,
wherein the processing unit 120 is configured to define which group of groups of bits $Y_1, \ldots, Y_k$ is written into the memory 110 directly or invertedly,
wherein the processing unit 120 is configured to form the P bits $d_1, \ldots, d_P$ to be written into the memory 110, wherein for 1, . . . P, $d_i = \overline{y_i}$ when $y_i$ belongs to the group whose bits are written into the memory 110 invertedly, and $d_i = y_i$ when $y_i$ does not belong to any group whose bits are written into the memory 110 invertedly,
wherein the processing unit 120 is configured to write the bits $d_1, \ldots, d_P$ into the memory 110 at an address a,
wherein the processing unit 120 is configured to create an address a and to read out the possibly erroneous values $d'_1, \ldots, d'_P$ stored at the address a, which have originated from the values $d_1, \ldots, d_P$ written at the address a by possible errors,
wherein the processing unit 120 is configured to define L bit positions $k_1, \ldots, k_L$ to be corrected by code C with l≤P and $\{k_1, \ldots, k_L\} \subseteq \{1, \ldots, P\}$, that are to be corrected by using the code C in the case of an erroneous value, wherein the bit positions at which $bf_1, \ldots, bf_l$ have been stored directly or invertedly belong to the bit positions to be corrected,
wherein the processing unit 120 is configured to determine binary correction values $e_{k_1}, \ldots, e_{k_L}$ of the defined L bit positions $k_1, \ldots, k_L$ to be corrected based on the code C for errors correctable by the code C,
wherein the processing unit 120 is configured to form corrected bits $$d_{k_i}^{cor} = d'_{k_i} op\, e_{k_i}$$

at least at the bit positions at which values $bf_1, \ldots, bf_l$ have been stored directly or invertedly, wherein op is a uniquely invertible Boolean operation,
wherein the processing unit 120 is configured to determine, based on the known inserted values $bf_1, \ldots, bf_l$ and the respective read-out values corrected by using the code C, for which group $Y_1, \ldots, Y_k$ the bits have been stored directly or invertedly, wherein the processing unit 120 is configured to output the bits $$y_{k_i}^{cor} = d'_{k_i} op\, e_{k_i}$$

if $Y_{k_i}$ belongs to a group of bits whose bits have been written directly into the memory 110 and outputting the bits $$y_{k_i}^{cor} = \overline{d'_{k_i} op\, e_{k_i}}$$

if $y_k$ belongs to a group of bits that have been written into the memory 110 invertedly during writing into the memory 110, wherein "op" is a two-ary uniquely invertible Boolean operation, wherein, if the address bits are involved in error detection and error correction, the processing unit 120 is configured to form a codeword $y = y_1, \ldots, y_P$ of the code C, wherein C is a linear systematic code with a generator matrix G in systematic form and an H-matrix H, wherein $$y = y_1, \ldots, y_P$$
$$= (u_1, \ldots, U_N) \cdot G =$$
$$= c_1, \ldots, c_m, bf_1, \ldots, bf_l, x_1, \ldots, x_n, A_1, \ldots, A_k$$

applies, the generator matrix G is an (N,P)-matrix and the H-matrix $H=(h_1, \ldots, h_P)$ is an ([P−N],P)-matrix, so that all columns of the H-matrix are pairwise distinct and unequal to 0 and P=n+l+m+k, N=n+l+k holds and $c_1, \ldots, c_m$ are check bits, wherein the processing unit 120 is configured to determine K subsets $Y_1 = \{y_{1,1}, \ldots, y_{1,q1}\}, \ldots, Y_K = \{y_{K,1}, \ldots, y_{K,qK}\}$ of the bits $$y_1, \ldots, y_{n+l}, y_{n+l+k+1}, \ldots, y_P = c_1, \ldots, c_m, bf_1, \ldots, bf_l,$$
$$x_1, \ldots, x_n,$$

so that each bit of the bits $bf_1, \ldots, bf_l$ belongs to only one of the subsets $Y_1, \ldots, Y_K$, and so that If $y_1^b, \ldots, y_P^b$ are binary values of the bits $y_1, \ldots, y_P$, then $y_1^b, \ldots, y_P^b$ is a codeword of the code C if for k=1, . . . , K and for j=1, . . . , P, it applies that
if $y_j$ is an element of the subset $Y_k$, then $y_j^b=1$ and if $y_j$ is no element of the subset $Y_k$, then $y_j^b=0$, so that $$H \cdot (y_1^b, y_2^b, \ldots, y_P^b) = 0$$

applies and H is the H-matrix of code C,
wherein the processing unit 120 is configured to define which group of bits $Y_1, \ldots, Y_k$ are written into the memory 110 directly or invertedly,
wherein the processing unit 120 is configured to form the P−k bits $d_1, \ldots, d_{m+l+n}$, to be written into the memory 110, wherein for i=1, . . . , m+n+l,
$d_i = y_i$ when $y_i$ belongs to a group whose bits are written into the memory 110 directly, and
$d_i = \overline{y_i}$ when $y_i$ belongs to a group whose bits are written into the memory 110 invertedly,
wherein the processing unit 120 is configured to write the bits $d_1, \ldots, d_{m+n+l}$ at an address a into the memory 110,
wherein the processing unit 120 is configured to create an address a and reading out possibly erroneous values $d'_1, \ldots, d'_{m+n+l}$ stored at the address a, which have originated from values $d_1, \ldots, d_{n+l}, d_{n+k+1}, \ldots, d_P$ written at the address a by possible errors,
wherein the processing unit 120 is configured to define L bit positions $k_1, \ldots, k_L$ with L≤P−k that are corrected by using the code C in the case of an erroneous value, wherein the bit positions at which $bf_1, \ldots, bf_I$ have been stored directly or invertedly belong to the bit positions to be corrected, wherein the processing unit 120 is configured to determine binary correction values $e_{k_1}, \ldots, e_{k_L}$ of the defined L bit positions $k_1, \ldots, k_L$ for errors correctable by the code C, wherein the processing unit 120 is configured to form corrected bits $$d_{k_i}^{cor} = d'_{ki} op e_{k_i}$$

at least at the bit positions at which the values $bf_1, \ldots, bf_I$ have been stored directly or invertedly, wherein "op" is a binary uniquely invertible operation, wherein the processing unit 120 is configured to determine, based on the known inserted values $bf_1, \ldots, bf_I$ and the corresponding correct values read out and corrected by using the code C, for which group of the bits $Y_1, \ldots, Y_k$ the bits have been stored directly or invertedly, and wherein the processing unit 120 is configured to output the bits $$y_{k_i}^{cor} = d'_{ki} op e_{k_i}$$

if $y_{k_i}$ belongs to a group of bits whose bits have been written directly into the memory 110, and to output the bits $$y_{k_i}^{cor} = \overline{d'_{ki} op e_{k_i}}$$

if $y_{k_i}$ belongs to a group of bits that have been written into the memory 110 invertedly during writing into the memory 110, wherein "op" is a two-digit reversible unique Boolean operation.

According to another embodiment, an apparatus for storing bits in a memory 110 is provided, wherein the bits are encoded with a linear error correcting code C, the linear error correcting code C having a code distance which is at least 3, wherein it is determined whether a subset of the bits encoded with the linear error correcting code C is written into the memory 110 directly or in a bit-by-bit inverted manner, and wherein the code C comprises an H-matrix H, wherein the apparatus comprises a processing unit 120, and a memory 110. A subset of bits written into the memory 110 either directly or invertedly comprises at least one binary constant value, which is together with payload data bits used for coding for forming a codeword of the linear code C. The processing unit 120 is configured to write the binary constant value as a binary value bf into the memory 110 when the bits of the respective subset of bits are directly written into the memory 110. The processing unit 120 is configured to write the binary constant value into the memory 110 as an inverted value $\overline{bf}$ when the bits of the respective subset of bits are invertedly written into the memory 110.

The processing unit 120 is configured to convert a codeword of the code C to a codeword of the same code when the subset of bits written into the memory 110 either directly or invertedly is inverted and the H-matrix of the code is formed such that the number of ones of each component of the columns of the H-matrix corresponding to the subset of bits written into the memory 110 either directly or invertedly, is even.

Moreover, the processing unit 120 is configured to correct, when reading out from the memory 110, possibly erroneous bits read out from the memory 110 by using the linear error correcting code C, wherein at least that bit at the bit position at which the constant binary value bf has been written is corrected when the respective subset of bits has been written into the memory 110 directly, or at the bit position at which the constant binary value $\overline{bf}$ has been written, when the respective subset of bits has been written into the memory 110 invertedly.

Furthermore, the processing unit 120 is configured to invert bits of the subset of bits that have been written into the memory 110 directly or invertedly after reading out when the corrected value that has been read out at the bit position at which the constant value bf or the inverted constant value $\overline{bf}$ has been stored is equal to $\overline{bf}$, and not inverted, when this value is equal to bf.

According to another embodiment, a method is provided. The method comprises:

Encoding a plurality of bits to obtain a plurality of encoded bits by employing a linear error correcting code, wherein each of the plurality of encoded bits has a bit value, wherein the error correcting code has a code distance which is at least 3, and wherein the plurality of encoded bits forms a first codeword of the linear error correcting code.

Determining an inversion decision indicating whether a subset of the encoded bits shall be inverted or not depending on the subset of the encoded bits, wherein the subset of the encoded bits is determined such that the first codeword of the error correcting code is transformed into a second codeword of that code if all bits of the subset are inverted and wherein the subset comprises all encoded bits of the plurality of encoded bits or comprises at least three of the encoded bits of the plurality of encoded bits, and wherein an encoded bit of the subset of the encoded bits is an indication bit, wherein the bit value of the indication bit is equal to a first predefined bit value.

When the inversion decision indicates that the subset of the encoded bits shall not be inverted, storing, as a stored word, bits of the first codeword into the memory, wherein the bits of the first codeword stored in the memory comprise the indication bit having the first predefined bit value. And:

When the inversion decision indicates that the subset of the encoded bits shall be inverted, modifying the first codeword of the linear error correcting code to obtain the second codeword of the linear error correcting code by inverting each encoded bit of the subset of the encoded bits by changing its bit value, and storing as the stored word the second codeword into the memory, wherein the second codeword comprises the indication bit being inverted so that the bit value of the indication bit is equal to a second predefined bit value being different from the first predefined bit value.

In the following, basic principles of embodiments are described.

Embodiments relate to writing data into memories and reading the data from the memories. Embodiments allow to directly or invertedly write subsets or groups of bits, which shall be stored, into a memory in an effective manner, and further allows to restore them in their original form when reading them from the memory.

Whether a subset or a group of bits is written into a memory directly or invertedly may, for example, be determined by the values of the bits of the subset, or may, e.g., be determined by the characteristics of the memory with respect to errors or energy consumption, or may, for example, be determined by other characteristics.

For example, for a memory which exhibits permanent memory errors with value 0 more often than memory errors with value 1, it can be advantageous to write the bits to be stored into the memory directly (as they have more zeros than ones), since then the probability that a value 0 will be written into a memory cell, which exhibits a permanent memory error wherein the bit is stuck-at 0, is higher compared to the probability that a value 1 is written into such a memory cell. Thereby, the probability that a permanent memory error results in erroneous behaviour can be reduced.

It is also possible to write bits tentatively into the memory directly and then invertedly and to decide then the variant where less errors have occurred.

Many non-volatile memory concepts, such as the classic floating gate memory (e.g., EEPROM=electrically erasable programmable read-only memory, Flash) or charge trapping memory (e.g., MONOS, Nanodot), but also novel memory concepts such as MRAM=Magnetoresistive Random Access Memory, R-RAM, PCRAM or CBRAM (Conductive Bridging Random Access Memory), have intrinsically given preferred values for the reliability of the cells, or for the current consumption during writing. For example, the classical floating gate exhibits an erratic bit, well-known by a person skilled in the art, wherein the erratic bit indicates data corruption when programming a state with a low cut-off voltage. The current consumption during reading or writing depends significantly on the data pattern to be programmed/to be read. The reading of cells with low cut-off voltage inherently requires significantly more current compared to reading with a high cut-off voltage. When programming, the situation might possibly be opposite. For example, when hot-carrier programming, only the cell that has to be brought into the state with high cut-off voltage needs programming current. The situation is similar for the charge trapping concept. Likewise, for novel memories, e.g., MRAM, exhibiting energetic asymmetry of the magnetic anisotropic energy, the higher energetic state is more at danger in data storage than the state having lower energy. Embodiments, however, may not only be employed for non-volatile memories, but can also be used, for example, for permanent errors or for errors occurring more frequently for a particular state within an SRAM or DRAM.

If the energy consumption during writing a first binary value $b_1$ is higher than during writing a second binary value $b_2=\bar{b}_1$, then it will be possible to write the data into the memory directly or invertedly depending on whether the bits to be written include more values $b_1$ or more values $b_2$. In this way, it is possible to write at most the same number of values $b_1$ as the number of values $b_2$, so that the energy consumption is reduced.

Based on the number of values $b_1$ or based on the number of bits $b_2$ of a subset of bits of a group of bits, it can be decided, whether the bits of the group are to be written into the memory invertedly or directly. By this, the effort for determining, whether a subset of bits is written into the memory directly or invertedly, can be reduced.

In embodiments, the bits to be stored shall, e.g., be encoded by using a linear error correcting code C having a generator matrix G and an H-matrix or parity check matrix H, wherein address bits, indicating where the bits are to be stored, may, but need not be involved in the encoding. For example, it may be advantageous to perform encoding with a generator matrix G, being in a systematic form, wherein the G-matrix comprises a unit matrix as a sub-matrix, wherein the H-matrix in some embodiments may exhibit a systematic form and in other embodiments may exhibit a non-systematic form. In order to check, when reading out bits from the memory, whether bits of a subset of bits have been written into the memory directly or invertedly, the bits (which may, for example, later again be stored) are supplemented by constant binary values. Here, the supplemented constant binary values are involved in forming the respective codewords of the linear code.

The subsets of the bits that are directly or invertedly written into the memory are formed such that a codeword of the code C, which has been formed from non-inverted bits, is transferred into another codeword of the code C, when the bits of a subset of bits, that can be written into the memory invertedly or directly, are inverted.

This characteristic advantageously allows performing correction of bits being read out from the memory and possibly of erroneous bits on the basis of the error correcting code C without having to know, for the correction of the bits read out from the memory, whether the bits from the read-out subset of bits have been written into the memory directly or invertedly.

When reading out the data from the memory, then, after correcting the data by using the corrected bits in the bit positions at which the bits with the constant values have been written directly or invertedly, it can be found out whether the bits of a subset or group of bits has been written into the memory directly or invertedly.

Linear error correcting codes, known to the skilled person, are used as error correcting codes. Examples for such codes are Hamming codes, Hsiao codes, BCH codes, etc. Frequently, shortened codes are used, such as shortened Hamming codes, shortened Hsiao codes or shortened BCH codes, to adapt the codes to the necessary bit width of the data to be stored. Shortened codes can be obtained from unshortened codes by deleting columns of the respective H-matrix not corresponding to the check bits.

For better understanding of used terms and the description of embodiments, several basic terms of codes will briefly be described in the following.

A linear code C comprises a generator matrix or G-matrix G and an H-matrix H. If C is a (Q,N)-code, then a codeword comprises Q bits, wherein a codeword is designated by $y=y_1, \ldots, y_Q$, and N information bits exist, referred to as $u=u_1, \ldots, u_N$, wherein Q>N applies.

The G-matrix is an (N,Q)-matrix having N rows and Q columns, the H-matrix is an (m,Q)-matrix, wherein m=Q−N applies. From the information bits u, a codeword y is determined according to the relationship $$y = u \cdot G$$

If the code C is a systematic code, then the generator matrix G has the form $$G = (P_{N,m}, I_N) \text{ with } m = Q-N,$$

wherein $I_N$ is the N-dimensional unit matrix and $P_{N,m}$ is the parity matrix.

An assigned H-matrix may be defined as $$H = (I_m, P_{m,N}^T),$$

wherein $I_m$ is the m-dimensional unit matrix and $P_{m,N}^T$ is the transpose of the parity matrix $P_{N,m}$, where rows and columns are exchanged. If the values of N, Q, m are not to be referred to specifically, or if these values are known from the context, then simply G=(P,I) and H=(I,$P^T$) is written.

It is known that the G-matrix and the H-matrix in systematic form are also used as G=(I,P) and H=($P^T$,I), what has the effect, that the check bits are arranged at the left of the information bits within a codeword, or that the check bits are arranged at the right of the information bits within a codeword.

The N rows of the G-matrix are codewords of the code C. In a systematic code C $$y = y_1, \ldots, y_Q = (u_1, \ldots, u_N) \cdot G \cdot = c_1, \ldots, c_m, u_1, \ldots, u_n,$$

applies, wherein $c_1, \ldots, c_m, u_1, \ldots, u_N \cdot P$ are check bits of the codeword $y_1, \ldots, y_Q$. The information bits $u_1, \ldots, u_N$ are an unamended part of the codeword, wherein the check bits are added to the information bits. Due to errors, a codeword $y = y_1, \ldots, y_Q$ can be corrupted to a different word $y' = y'_1, \ldots, y'_Q$, wherein e with $$e = e_1, \ldots, e_Q = y_1 + y'_1, \ldots, y_Q + y'_Q = y + y'$$

is referred to as error vector, and wherein "+" designates the component-wise addition modulo 2 or the XOR operation.

The error syndrome s of a word y' is $$s = H \cdot y',$$

wherein $s = s_1, \ldots, s_m$ comprises m components. The error syndrome of a word $y^*$ is exactly equal to 0, if $y^*$ is a codeword of the code C.

If y is a codeword and if y' is an erroneous word resulting from errors, wherein $y + y' = e$, then the following applies $$H \cdot (y') = H \cdot (0 + y') = H \cdot (y + y') = H \cdot e$$

and the error syndrome of the word y' only depends on the error vector, e by which y' differs from the codeword y.

If an i-bit error exists, exactly i bits of the error vector e are equal to 1, and all other components are equal to 0. If, for example, exactly one component of the error vector e is equal to 1, then a 1-bit error exists in the bit where the component of e is equal to 1.

If the code C is a 1-bit error correcting code, then the error syndromes of all 1-bit errors are pairwise distinct and are different from 0, and to each of these error syndromes, a particular 1-bit error is then uniquely allocated. A decoder implemented as a decoder circuit then determines from the error syndrome applied to its input, which bit position is to be inverted/corrected.

If the code C is a 2-bit error correcting code, then the error syndromes of all 2-bit errors and all 1-bit errors are pairwise different and are also different from 0, and to each of these error syndromes, a determined 2-bit error or 1-bit error is uniquely allocated. A decoder realized as a decoder circuit then determines from the error syndrome applied to its input, which bit position is inverted/corrected. Respective statements apply for 3-bit error correcting codes, 4-bit error correcting codes, . . . , etc.

The error syndrome may, e.g, be determined by a syndrome generator implementing for a word $w = w_1, \ldots, w_Q$ the relation $$s(w) = H \cdot w$$

for example by using XOR gates.

If $y = y_1, \ldots, y_Q$ and $v = v_1, \ldots, v_Q$ are codewords of the code C, then y+v is also a codeword of the code C.

Furthermore, the following applies:

If $y = y_1, \ldots, y_Q$ is a codeword of the code C, and $w = w_1, \ldots, w_Q$ is a word having the error syndrome $s(w) = H \cdot w$, then the error syndrome of the word w+y is equal to the error syndrome s(w) of the word w, since $$H \cdot (y + w) = H \cdot y \cdot H \cdot w = s(w)$$

applies, and since the error syndrome of a word does not change when a codeword is added modulo 2 by a component-wise addition to the word. Adding a codeword $y = y_1, \ldots, y_Q$ to a word $w = w_1, \ldots, w_Q$ means that those components of w are inverted, where the components of y are equal to 1.

If specifically $$\underbrace{1, \ldots, 1}_{Q}$$

is a codeword of the code C, then, with $y = y_1, \ldots, y_Q$, $\overline{y} = y_1 + 1, \ldots, y_Q + 1 = \overline{y}_1, \ldots, \overline{y}_Q$ is likewise a codeword of the code C and the syndrome s(w) of a word $w = w_1, \ldots, w_Q$ does not change when all components of w are inverted.

If M is a subset of bits of a codeword $y = y_1, \ldots, y_Q$ of the error correcting code C whose bits are written into the memory directly or invertedly, it is advantageous when the word $$y^M = y_1^M, \ldots, y_Q^M \text{ with } y_i^M = 1, \text{for } y_i \in M \text{ and } y_i^M = 0 \text{ for } y_i \notin M$$

is a codeword of the code C.

If the bits of a codeword $y_1, \ldots, y_Q$ that belong to the set M are inverted, then the resulting word $y_1 + y_1^M$, $y_2 + y_2^M, \ldots, y_Q + y_Q^M$ is again a codeword. Independent of whether the original codeword $y_1, \ldots, y_Q$ or the codeword inverted in the bits, which belong to the set M, is written into the memory, in both cases a codeword of the code C is written into the memory. When reading out the stored, possibly erroneous codeword $y' = y'_1, \ldots, y'_Q$ or $(y + y^M)'$, the correction of read-out bits with the code C can be performed based on the error syndrome formed of y' or (y+y)', without having to know whether y or the codeword $y + y^M$, which is inverted in the bits belonging to the set M, has been written into the memory, since the error syndrome depends only on the occurred errors, e.g., only on the occurred error vector e, and not on which codeword has been written into the memory. It may, for example, be advantageous that the values read out at the bit positions, at which the constant binary values $bf_1, \ldots, bf_l$ have been written, can be corrected after reading out, and that after the correction with the code C, it can then be determined based on these already corrected values, whether the codeword y has been stored directly or in the bits belonging to M.

It is moreover advantageous that the constant binary values are corrected with the same code C, such as the stored payload data bits, wherein the number of check bits normally does not increase by this correction. If $$\underbrace{1, \ldots, 1}_{Q}$$

is a codeword of the code C, a subset M of bits can consist of all bits of a codeword $y = y_1, \ldots, y_Q$ when the address bits are not involved in the encoding.

Groups of bits $M_i$ with $i = 1, 2, \ldots,$ where a codeword can be inverted, wherein the codeword inverted in the bits of $M_i$ is again a codeword of the code C, can easily be determined.

Groups or subsets of bits wherein a codeword of the code C inverted in the bits of the subset is again a codeword of the code C, can be easily determined, since the subset of bits of an arbitrary codeword of the code C which are equal to 1 form such a subset.

Since such a subset of bits can be determined for each codeword, there is a plurality of suitable subsets of bits.

Particular embodiments will now be described.

In a first embodiment, as an example of an error correcting code C, a 1-bit error correcting (15, 11)-Hamming code of the length Q=15 with N=11 information bits will be considered.

The H-matrix of the considered code C is $$H = \begin{pmatrix} 1 & 0 & 0 & 0 & 1 & 1 & 0 & 1 & 0 & 1 & 0 & 1 & 1 & 1 & 0 \\ 0 & 1 & 0 & 0 & 1 & 1 & 0 & 0 & 1 & 0 & 1 & 1 & 1 & 0 & 1 \\ 0 & 0 & 1 & 0 & 1 & 0 & 1 & 1 & 0 & 0 & 1 & 1 & 0 & 1 & 1 \\ 0 & 0 & 0 & 1 & 1 & 0 & 1 & 0 & 1 & 1 & 0 & 0 & 1 & 1 & 1 \end{pmatrix} \quad (1)$$

The variables $c_1, c_2, c_3, c_4, bf_1, x_1, x_2, x_3, x_4, x_5, x_6, x_7, x_8, x_9, x_{10}$ correspond, from left to right, to the columns of the H-matrix of Formula (1).

Since each of the four rows of the H-matrix comprises 8 ones and 8 is an even number, $$\underbrace{1, \cdots, 1}_{15}$$

is a codeword of the code C, and a codeword inverted in a component-wise way in all its 15 bits is again a codeword of code C.

K=1 and a subset $M_1 = M = \{y_1, \ldots, Y_{15}\}$ comprising all bits of a codeword are selected.

10 payload data bits $x_1, \ldots, x_{10}$ are provided which are supplemented by a constant binary value $bf_1$ to 11 information bits $$u = u_1, \ldots, u_{11} = bf_1, x_1, \ldots, x_{10}$$

In an embodiment, the constant binary value is defined as $bf_1 = 0$. The code C comprises four check bits $c_1, \ldots, c_4$. The encoded bits $y_1, \ldots, y_{15}$ are determined as $$y_1, \ldots, y_{15} = c_1, \ldots, c_4, bf_1, x_1, \ldots, x_{10} = (bf_1, x_1, \ldots, x_{10}) \cdot G$$

by using a G-matrix G of the code C. Thereby, the G-matrix is the matrix $G = (I_{11}, P_{11,5})$, wherein $I_{11}$ is the 11-dimensional unit matrix, for $P_{11,5}$.

$$P_{11,5} = \begin{pmatrix} 1 & 1 & 1 & 1 \\ 1 & 1 & 0 & 0 \\ 0 & 0 & 1 & 1 \\ 1 & 0 & 1 & 0 \\ 0 & 1 & 0 & 1 \\ 1 & 0 & 0 & 1 \\ 0 & 1 & 1 & 0 \\ 1 & 1 & 1 & 0 \\ 1 & 1 & 0 & 1 \\ 1 & 0 & 1 & 1 \\ 0 & 1 & 1 & 1 \end{pmatrix} \quad (2)$$

applies, and for $$c_1 = bf_1 + x_1 + x_3 + x_5 + x_7 + x_8 + x_9$$

$$c_2 = bf_1 + x_1 + x_4 + x_6 + x_7 + x_8 + x_{10}$$

$$c_3 = bf_1 + x_2 + x_3 + x_6 + x_7 + x_9 + x_{10}$$

$$c_4 = bf_1 + x_2 + x_4 + x_5 + x_8 + x_9 + x_{10} \quad (3)$$

applies.

The coder forms according to the relations defined in Formulae (3) the check bits $c_1, \ldots, c_4$ from the information bits $bf_1, x_1, \ldots, x_{10}$. For example, the coder may be implemented with XOR gates or by using a common synthesis tool. K=1 applies and there is only one subset $Y_1 = \{y_1, \ldots, y_{15}\}$ of bits to be inverted.

Since $$\underbrace{1, \cdots, 1}_{15}$$

is a codeword of the code C, with $y = y_1, \ldots, y_{15}$, consequently, $\bar{y} = \bar{y}_1, \ldots, \bar{y}_{15}$ is also a codeword of code C, since all bits $y_1, \ldots, y_Q$ with Q=15 belong to $Y_1$.

As a specific codeword, the codeword formed of the data bits $x_1, x_2, \ldots, x_{10} = 1,0,1,1,0,1,1,1,1,1$ and the constant binary value $bf_1 = 0$ will now be considered. According to Formula (3), $c_1 = 1, c_2 = 0, c_3 = 1$ and $c_4 = 0$, so that the respective codeword is $$y_1, \ldots, y_{15} = 1,0,1,0,0,1,0,1,1,0,1,1,1,1,1$$

The codeword has 10 ones and 5 zeros. An example is considered, where it is advantageous to write as many zeros as possible into the memory. It is possible for a stored value 0 to be less frequently corrupted to a stored value 1, than vice versa, as can be the case in an MRAM. It is also possible that writing a value 0 requires less energy than writing a value 1, as can be the case in a Flash memory. It is also possible that permanent errors exist at one or several positions in the memory. Thus, it is possible that a stuck-at-0 error exists at the position of the bit $y_Q = y_{15}$. If the word 1,0,1,0,0,1,0,1,1,0,1,1,1,1,1 is written exemplarily into the memory, as can be the case when writing into a Flash memory, and if the written values are compared with the read-out values, it can be seen that at the position of $y_{15}$ a stuck-at-0 error exists, since a value 0 is read out instead of the written value 1, as $y_{15} = 1$ has been written into the memory. If, however, it is decided that the bits of $Y_1$, e.g., in this case all bits, are invertedly written into the memory, then $$d_1, \ldots, d_{15} = \bar{y}_1, \ldots, \bar{y}_{15} = 1,0,1,1,1,0,0,1,0,0,0,0,0,0,0$$

is written into the memory at an address a, and a possible stuck-at-0 error in the 15$^{th}$ bit has no effect. If no further errors exist and if read out is conducted at the address a $$d_1', \ldots, d_{15}' = 1,0,1,1,1,0,1,0,1,0,0,0,0$$

it can be seen, for example by determining the error syndrome of the read-out word $$s = H \cdot (1,0,1,1,1,0,0,1,0,0,0,0,0,0,0) = 0,$$

that a codeword of the code C has been read out, and that no error correction is necessary.

It can be concluded from the value $d_5' = 1$, that the word has been invertedly written into the memory. In order to restore the original word, all read-out bits $d_1', \ldots, d_{15}'$ are to be inverted, so that $$y_1, \ldots, y_{15} = \bar{d}_1', \ldots, \bar{d}_{15}'$$

applies.

If, for example, an error exists, which corrupts the read-out value $d_5'$ from 1 to 0, this error is then corrected to 1 by the same code C, which also corrects errors in other bits as will be described below in more detail.

Advantageously, the effort for error correction is low. Only one additional bit having a constant value is required to indicate, whether the bits of the codeword have been written into the memory directly or indirectly (invertedly).

Thereby, the memory can, for example, be a register, a register array, an RAM, an M-RAM or a Flash memory.

Writing into the memory will now be discussed with reference to FIG. 2 using an addressable memory as an example.

Figure 2:
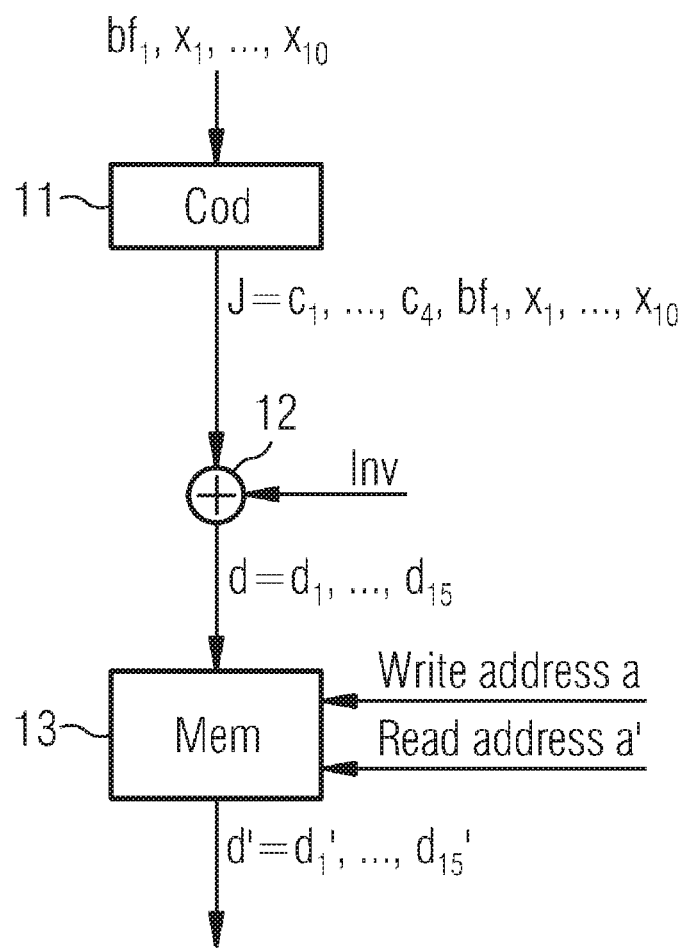
FIG. 2 illustrates an apparatus according to a further embodiment.

In FIG. 2, the data bits $x_1, \ldots, x_n$ with n=10 and a bit $bf_1$ carrying a constant value, e.g., the value 0, are fed into the input of a coder Cod 11, implemented such that the coder Cod 11 forms the codeword $y=y_1, \ldots, y_Q$ with Q=15 according to $$y=y_1, \ldots, y_{15}=c_1, \ldots, c_4, bf_1, x_1, \ldots,$$
$$x_{10}=(bf_1, x_1, \ldots, x_{10}) \cdot G$$

which is output at a 15 bit-wide output of the coder Cod 11.

Here, it is assumed that the code C is given in its systematic form. The output of the coder 11 is fed into an XOR circuit 12 having a first 15 bit-wide input. Moreover, the XOR circuit 12 comprises a second 1 bit-wide input to which a binary inversion signal Inv is applied. Furthermore, the XOR circuit 12 comprises a 15 bit-wide output which carries the values $d_1, \ldots, d_{15}$, and which is connected to a 15 bit-wide data input of a memory Mem 13.

In FIG. 2, the XOR circuit 12 may, for example, comprise 15 XOR gates, wherein each of the 15 XOR gates has two inputs and one output, wherein a first input of each of these XOR gates is connected to one of the 15 binary output lines of the coder Cod 11, while the second input of each of the 15 XOR gates is connected to the second input of the XOR circuit 12 carrying the inversion signal Inv.

If Inv=0 then $d_1, \ldots, d_{15}=y_1, \ldots, y_{15}$ applies, while if Inv=1 then $d_1, \ldots, d_5=\bar{y}_1, \ldots, \bar{y}_{15}$ applies, so that, depending on the inversion signal, the bits being output by the coder, are either directly (unamended/not modified) or invertedly written into the memory.

When writing data, the memory Mem 13 is provided with a write address a, and the data applied to the data inputs of the memory Mem 13 are stored at the address a.

When a read address a' is applied, and when reading data, the data being stored at a read address a' are read. If the write address a is equal to the read address a', i.e. when a=a', then the values $d_1', \ldots, d_{15}'$ will be output at data outputs. It is possible that the data $d_1, \ldots, d_{15}$, written at an address a, and the data $d_1', \ldots, d_{15}'$ read out from the same address a, differ due to errors.

From the values read out from the memory Mem 13, the error syndrome $$S=H \cdot (d_1', \ldots, d_{15}')$$

with $s=(s_1, s_2, s_3, s_4)$ and $$s_1=d_1'+d_5'+d_6'+d_3'+d_{10}'+d_{12}'+d_{13}'+d_{14}'$$

$$s_2=d_2'+d_5'+d_6'+d_9'+d_{11}'+d_{12}'+d_{13}'+d_{15}'$$

$$s_3=d_3'+d_5'+d_7'+d_8'+d_{11}'+d_{12}'+d_{14}'+d_{15}'$$

$$s_4=d_4'+d_5'+d_7'+d_9'+d_{10}'+d_{13}'+d_{14}'+d_{15}' \quad (4)$$

applies. The error syndrome $s=(s_1,s_2,s_3,s_4)$ is determined by a syndrome generator Syn (not shown in FIG. 2) realizing the Formulae (4). Implementing Formulae (4), for example may be conducted by using a synthesis tool. To each of the bits $d_1', \ldots, d_{15}'$ to be corrected a syndrome is allocated in an uniquely invertible manner, as is illustrated in Table 1, as can be read from Formulae (4).

TABLE 1

| $s_1$ | $s_2$ | $s_3$ | $s_4$ | bit to be corrected |
|---|---|---|---|---|
| 0 | 0 | 0 | 0 | — |
| 0 | 0 | 0 | 1 | $d'_4$ |
| 0 | 0 | 1 | 0 | $d'_3$ |
| 0 | 0 | 1 | 1 | $d'_7$ |
| 0 | 1 | 0 | 0 | $d'_2$ |
| 0 | 1 | 0 | 1 | $d'_9$ |
| 0 | 1 | 1 | 0 | $d'_{11}$ |
| 0 | 1 | 1 | 1 | $d'_{15}$ |
| 1 | 0 | 0 | 0 | $d'_1$ |
| 1 | 0 | 0 | 1 | $d'_{10}$ |
| 1 | 0 | 1 | 0 | $d'_8$ |
| 1 | 0 | 1 | 1 | $d'_{14}$ |
| 1 | 1 | 0 | 0 | $d'_6$ |
| 1 | 1 | 0 | 1 | $d'_{13}$ |
| 1 | 1 | 1 | 0 | $d'_{12}$ |
| 1 | 1 | 1 | 1 | $d'_5$ |

If the codeword $y_1, \ldots, y_{15}=1,0,1,0,0,1,0,1,1,0,1,1,1,1,1$ with $y_5=bf_1=0$ inverted as $d_1, \ldots, d_{15}=0,1,0,1,1,0,1,0,0,1, 0,0,0,0,0$ has been written into the memory Mem 13, and if the read-out bits $d_1', \ldots, d_{15}'$ are $d_1', \ldots, d_{15}'=0,1,0,1,1, 0,1,0,0,1,0,0,0,0,0$, then, according to Formulae (4), $s=0$, $s_2=0$, $s_3=0$ and $s_4=0$ applies, and the read-out values are not corrected. Since $d_5'=1$ and the constant value $bf_1=0$ has been stored in the fifth bit directly or invertedly, the read-out word will be inverted component wise so that $$y_1^{cor}, \ldots, y_{15}^{cor}=\bar{d}'_1, \ldots, \bar{d}'_{15}=y_1, \ldots, y_{16}$$

applies.

If the bit $d_5'$ is erroneously corrupted to 0, $d_1', \ldots, d_{15}'=0,1,0,1,0,0,1,0,0,1,0,0,0,0,0$ is read out from the memory Mem 13 and the syndrome generator determines, according to equations (4), the error syndrome $s=(1,1,1,1)$. According to the last row in Table 1, the value $d_5'=bf_1=0$ is corrected to $d_5^{cor}=d_5'+1=\bar{d}_5'=1$. The corrected value 1 determines that the output corrected word $0,1,0,1,1,0,0,0,1,0,0, 0,1,0,0,0,0,0$ is inverted, so that $$y_1^{cor}, \ldots, y_{15}^{cor}=1,0,1,0,0,1,1,0,1,1,0,1,1,1,1,1$$

is output by the circuit.

In the following, an error in the data bits will be considered. If, for example, the value $d_{15}'$ is erroneously equal to 1, the word $d_1', \ldots, d_{15}'=0,1,0,1,1,0,1,0,0,1,0,0,0,0,1$ will be read out from the memory Mem 13. The syndrome generator forms, according to Formulae (4) the error syndrome $s=(0, 1,1,1)$, to which the bit $d_{15}'$ to be corrected is allocated by the decoder, so that the corrected word $d_1^{cor}, \ldots, d_{15}^{cor}$ is formed according to $$d_1^{cor}=d'_1, \ldots, d_{14}^{cor}=d'_{14}, d_{15}^{cor}=\bar{d}'_{15}$$

and so that the corrected word is $$d_1^{cor}, \ldots, d_{15}^{cor}=0,1,0,1,1,0,1,0,0,0,1,0,0,0,0,0.$$

Since $d_5^{cor}=1$ applies, the word is to be inverted, so that $$y_1^{cor}, \ldots, y_{15}^{cor}=\bar{d}_1^{cor}, \ldots,$$
$$\bar{d}_{15}^{cor}=101001011011111$$

applies, and the properly corrected word is output by the circuit.

Figure 3:
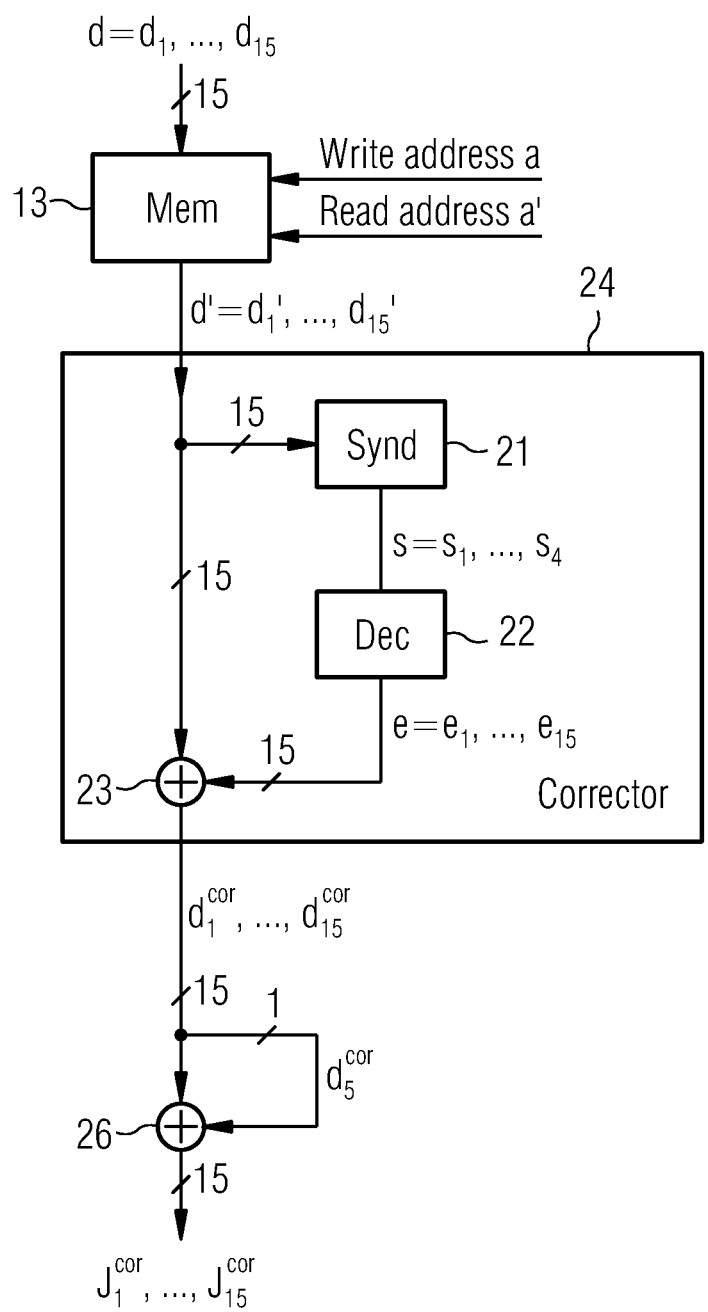
FIG. 3 illustrates an apparatus according to another embodiment.

FIG. 3 illustrates an apparatus according to an embodiment for reading out possibly erroneous data $d_1', \ldots, d_{15}'$, for correcting the erroneous data, and for inverting the data, if the data have been inverted prior to writing.

As in FIG. 2, the apparatus comprises a memory Mem 13 into which the data $d_1, \ldots, d_{15}$ have been written.

In FIG. 3, it is assumed that the memory is an addressable memory, that a write address a is created during writing, and a read address a' is created during reading. Here, the write address a can be the same as the read address a'. Some embodiments comprises further control signals of the memory Mem 13, such as an enable signal for writing and reading.

In some embodiments, the memory Mem 13 may be a register which may, e.g., comprise 15 memory elements. Memory elements may, e.g., be, flip-flops or latches.

When creating read address a', the possibly erroneous bits $d'=d'_1, \ldots, d'_{15}$ are output at the 15 data outputs of the memory Mem 13. It may be assumed that a'=a applies and that the data written at the write address a into the memory Mem 13 are read out from the same read address a. The read-out bits $d'_1, \ldots, d'_{15}$ may, e.g., differ from the written bits $d_1, \ldots, d_{15}$, since the read-out bits can be erroneous due to memory errors or due to errors on the data lines.

The bits $d'_1, \ldots, d'_{15}$, being read out onto the data outputs of the memory Mem 13, are fed into a 15 bit-wide input of a syndrome generator Synd 21 and also into a 15 bit-wide first input of an XOR circuit 23. The syndrome generator Synd 21 is implemented such that said syndrome generator Synd 21 forms an error syndrome $s=s_1,s_2,s_3,s_4$ according to Formulae (4). Said error syndrome is provided at a 4 bit-wide output of the syndrome generator Synd 21, wherein said output is connected to a 4 bit-wide input of a decoder Dec 22. The decoder Dec 22 outputs a correction signal $e=e_1, \ldots, e_{15}$ at its 15 bit-wide output. The decoder Dec 22 is configured such that it forms the correction signal according to table 1. The XOR circuit 23 e.g., comprises 15 XOR gates $XOR_1, \ldots, XOR_5$, wherein each of the 15 XOR gates has two inputs and one output.

For i=1, . . . , 15, the value $d'_i$ is fed into the first input of the XOR gate $XOR_i$ of the XOR-circuit 23 and the value $e_i$ is fed into the second input of the XOR gate $XOR_i$, so that the value $$d_i^{cor}=d'_i+e_i$$

is output at the output of the XOR gate $XOR_i$. The output of the XOR gate $XOR_5$ of the XOR circuit 23, which carries the value $d_5^{cor}=bf_1^{cor}$, is fed, since $bf_1=0$ has been selected, directly into a first 1 bit-wide input of an XOR circuit 26, which may, e.g., comprise 15 XOR gates $XOR_1', \ldots, XOR_{15}'$, wherein each of the 15 XOR gates has a binary output and two binary inputs.

The 15 bit-wide output of the XOR circuit 23 is connected to a second 15 bit-wide input of the XOR circuit 26.

For i=1, . . . , 15, the value $d_i^{cor}$ is fed into a first input of the XOR gate $XOR_i'$, while the output of the XOR gate $XOR_i$ is connected to the second input of this gate, said output carrying the signal $d_5^{cor}=bf_1^{cor}$. Thus the corrected values $d_1^{cor}, \ldots, d_{15}^{cor}$ are inverted if $d_5^{cor}=1$ and not inverted if $d_5^{cor}=0$. The syndrome generator Synd 21, the decoder Dec 22 and the XOR circuit 23 form a corrector 24, as illustrated in FIG. 3.

It is advantageous if the correction of the values $d'=d'_1, \ldots, d'_{15}$ read out from the memory Mem 13 is performed by the corrector 24 independent from whether $y=y_1, \ldots, y_{15}$ or $y=\overline{y}_1, \ldots, \overline{y}_{15}$ has been written into the memory. Moreover, it is advantageous that the constant binary value, which can be used for deciding whether the data has been written into the memory Mem 13 directly or invertedly, is involved in the correction of the possibly erroneous bits $d'_1, \ldots, d'_{15}$, read out from the memory Mem 13 by the linear code C, so that no additional bits, for example additional check bits, are required for the correction.

According to the embodiment of FIG. 3, the decoder Dec 15 generates binary correction values $e=e_1, \ldots, e_{15}$, so that in the represented case all 15 bits $d_1', \ldots, d_{15}'$ are corrected, if the bits are erroneous and if the errors are correctable by the code C.

However, according to some embodiments, only a part of the bits is corrected, for example, the bits corresponding to the data bits, and the bit $d_5'$ which corresponds to the constant binary value $bf_1$. In some embodiments, only a part of the values allocated to the data bits are corrected.

FIG. 3 illustrates the case that $bf_1$ is set to $bf_1=0$. It is also possible to set $bf_1$ to $bf_1=1$. Then, the data line carrying the value $d_5^{cor}$ applied to the first input of the XOR circuit 26 is to be inverted.

Figure 4:
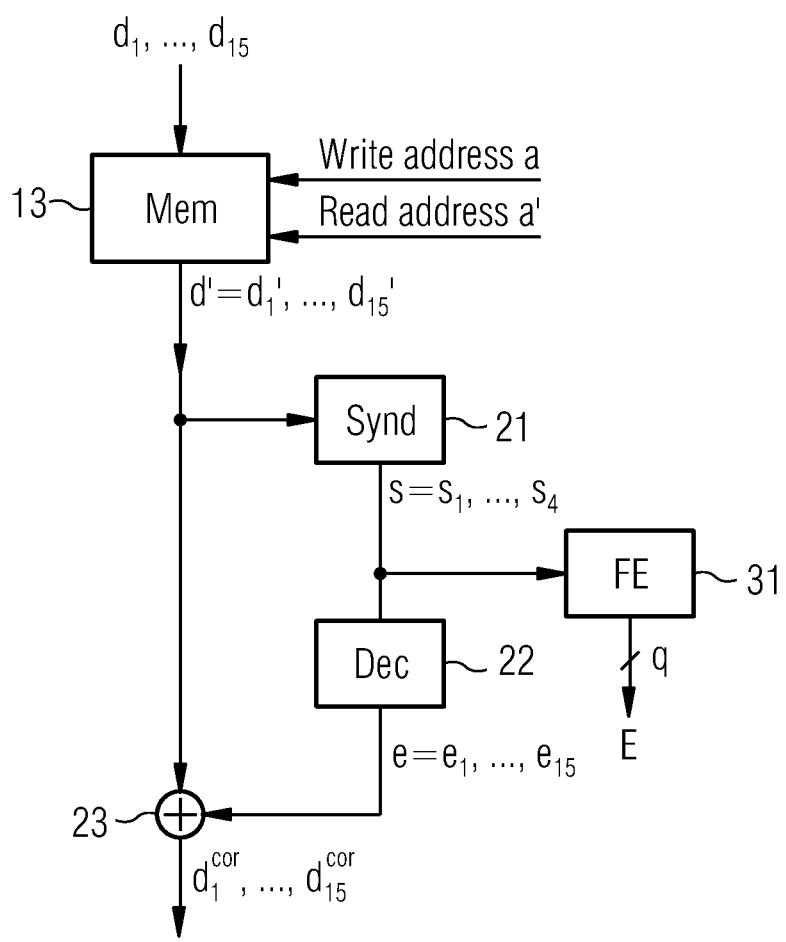
FIG. 4 illustrates an apparatus according to a further embodiment.

FIG. 4 illustrates an embodiment where an error detector FE 31 is employed.

The circuit parts, which corresponds to the circuit parts of FIG. 3, are indicated by the same reference numbers as in FIG. 3 and will not be described again.

In FIG. 4, the output of the syndrome generator Synd 21, which carries the error syndrome $s=s_1,s_2,s_3,s_4$, is connected to the input of the decoder Dec 22 and additionally to a 4 bit-wide input of an error detector FE 31, which outputs a q bit-wide error signal E at its output, wherein q≥1.

It is possible that the error detector FE 31 is implemented such that the error detector FE 31 outputs a 1 bit-wide error signal E=1, if the syndrome s is s≠0, and so that the error detector FE 31 outputs E=0 if the syndrome s is s=0. Then the error detector FE 31 can be realized by an OR gate having 4 inputs and one output.

In an embodiment, q=2. In such an embodiment, $E=(E_1, E_2)=0, 0$ is output, when s=0; E=1, 0 is output, when s is equal to one of the columns of the H-matrix of the code C; and E=0, 1 is output when s≠0 and is not equal to one of the columns of the H-matrix.

If E=1, 0, then an error, which is correctable by the code C, is detected. If E=0, 1, then an error, which is not correctable by the code C is detected. If E=0, 0, this means that no detectable error exists.

According to some embodiments, the error detector FE 31 may be implemented such that q=2 applies and, for example, E=0, 0 and E=1, 1 indicates that no error exists, and E=0, 1 or E=1, 0 indicates that an error exists.

In the following, further embodiments will be explained, wherein a code C has 8 data bits $x_1, \ldots, x_8$ and 6 check bits $c_1, \ldots, c_6$.

It is defined that K=2 subsets $Y_1, Y_2$ of bits are formed that can be directly or invertedly written into the memory Mem 13. The 8 data bits $x_1, \ldots, x_8$ are supplemented by two constant binary values $bf_1, bf_2$ to form 10 information bits $u_1, \ldots, u_{10}$, so that $$u_1, \ldots, u_{10}=bf_1, bf_2, x_1, \ldots, x_8.$$

The H-matrix of the considered code C may, e.g., be defined as $$H = \begin{pmatrix} 1 & 0 & 0 & 0 & 0 & 0 & 1 & 1 & 1 & 1 & 1 & 0 & 0 & 0 & 0 \\ 0 & 1 & 0 & 0 & 0 & 0 & 1 & 1 & 1 & 1 & 0 & 0 & 0 & 0 & 1 \\ 0 & 0 & 1 & 0 & 0 & 0 & 1 & 0 & 0 & 0 & 1 & 0 & 1 & 1 & 1 & 0 \\ 0 & 0 & 0 & 1 & 0 & 0 & 0 & 1 & 0 & 0 & 1 & 1 & 0 & 1 & 1 & 0 \\ 0 & 0 & 0 & 0 & 1 & 0 & 0 & 0 & 1 & 0 & 0 & 1 & 1 & 0 & 1 & 1 \\ 0 & 0 & 0 & 0 & 0 & 1 & 0 & 0 & 0 & 1 & 0 & 1 & 1 & 1 & 0 & 1 \end{pmatrix} \quad (5)$$

Variables $c_1,c_2,c_3,c_4,c_5,c_6, bf_1,bf_2, x_1,x_2,x_3,x_4,x_5,x_6,x_7,x_8$, from left to right, correspond to the columns of the H-matrix (5) from left to right, respectively, so that $c_1$ corresponds to the first column, $c_2$ corresponds to the second column, etc.

The code C of this embodiment is a shortened Hsiao code. All columns of the H-matrix are pairwise distinct and each column has an odd number of ones, since each column has either one or three ones.

Since each row of the H-matrix comprises an even number of ones, $$\underbrace{1, \cdots, 1}_{16}$$

is a code vector of the code C, and therefore, if $y=y_1, \ldots, y_{16}$ is a codeword of the code C, $\bar{y}=\bar{y}_1, \ldots, \bar{y}_{16} = y_1 \oplus 1, \ldots, y_{16} \oplus 1$ is also a codeword of the code C, since the component-wise XOR sum of two codewords of a linear code is again a codeword of this code.

As an example, the set $Y_1=\{c_1,c_2,c_3,c_4,c_5,c_6,bf_1,x_4\}$ is selected as a first subset $Y_1$ of bits that are directly or invertedly written into the memory, and the set $Y_2=\{bf_2,x_1,x_2,x_3,x_5,x_6,x_7,x_8\}$ is selected as a second subset.

Correspondingly, the $1^{st}$ to $7^{th}$ and the $12^{th}$ column of the H-matrix are allocated to the set $Y_1$. In the components of each of these columns, 2 ones exist, so that the component-wise modulo 2 sum of these columns of the H-matrix is equal to 0, wherein $$h_1+h_2+h_3+h_4+h_5+h_6+h_7+h_{12}=0,$$

wherein $$H \cdot (1,1,1,1,1,1,1,0,0,0,0,1,0,0,0,0)^T = 0$$

applies, and wherein $(1,1,1,1,1,1,1,0,0,0,0,1,0,0,0,0,)$ is codeword.

The $8^{th}$ to $11^{th}$ and the $13^{th}$ to $16^{th}$ columns of the H-matrix are allocated to the set $Y_2$. In the components of each of these columns 4 ones exist, so that the component-wise modulo 2 sum of these columns of the H-matrix is equal to 0, wherein $$h_8+h_9+h_{10}+h_{11}+h_{13}+h_{14}+h_{15}+h_{16}=0,$$

wherein $$H \cdot (0,0,0,0,0,0,0,1,1,1,1,0,1,1,1,1)^T = 0$$

applies and wherein $(0,0,0,0,0,0,0,1,1,1,1,0,1,1,1,1,)$ is also codeword of the considered code.

The sets $Y_1$ and $Y_2$ are disjunct and their union comprises all 16 components of a codeword.

Here, it is also possible to select a third set $Y_3$ of bits that can be directly or invertedly written into the memory Mem 13. Such a set $Y_3$ may comprise all bits of a codeword. The corrected values $d_7^{cor}$ and $d_8^{cor}$, which have been read out from the memory, determine which subsets of bits have been invertedly written into the memory Mem 13 and which subsets of bits have been directly written into the memory Mem 13.

In such an embodiment, there are four different options of writing a codeword $y_1, \ldots, y_{16}$ into a memory directly, in a partly inverted manner or in a completely inverted manner. It is assumed that $y_7$ and $y_8$ are set to the constant binary values $y_7=bf_1=0, y_8=bf_2=0$.

It is possible to write the words $$d_1, \ldots, d_{16}=c_1,c_2,c_3,c_4,c_5,c_6,0,0,x_1,x_2,x_3,x_4,x_5,x_6,x_7,x_8,$$

$$d_1, \ldots, d_{16}=\bar{c}_1,\bar{c}_2,\bar{c}_3,\bar{c}_4,\bar{c}_5,\bar{c}_6,1,0,x_1,x_2,x_3,$$
$$\bar{x}_4,x_5,x_6,x_7,x_8,$$

$$d_1, \ldots, d_{16}=c_1,c_2,c_3,c_4,c_5,c_6,0,1,\bar{x}_1,\bar{x}_2,\bar{x}_3,x_4,\bar{x}_5,\bar{x}_6,\bar{x}_7,$$
$$\bar{x}_8,$$

or $$d_1, \ldots, d_{16}=\bar{c}_1,\bar{c}_2,\bar{c}_3,\bar{c}_4,\bar{c}_5,\bar{c}_6,1,1,\bar{x}_1,\bar{x}_2,\bar{x}_3,\bar{x}_4,\bar{x}_5,\bar{x}_6,\bar{x}_7,$$
$$\bar{x}_8,$$

into the memory.

As, if $c_1,c_2,c_3,c_4,c_5,c_6,0,0$, $x_1,x_2,x_3,x_4,x_5,x_6,x_7,x_8$ is a codeword of the code C, then the values $d_1, \ldots, d_{16}$ written into the memory are codewords of the code C, irrespective of which subsets of bits have been inverted, the possibly erroneous values $d_1', \ldots, d_{16}'$ read out from the memory can be corrected by using the code C, without knowing which bit groups have been directly and which bit groups have been invertedly written into the memory.

In particular, the read-out values $d_7', d_8'$ can be corrected to $d_7^{cor}, d_8^{cor}$, wherein $d_7^{cor}, d_8^{cor}=0,0$ indicates that the bits of none of the bit groups have been inverted, $d_7^{cor}, d_8^{cor}=1,0$ indicates that the bits of the bit group $Y_1$ have been inverted, $d_7^{cor}, d_8^{cor}=0,1$ indicates that the bits of the bit group $Y_2$ have been inverted, $d_7^{cor}, d_8^{cor}=1,1$ indicates that the bits of the bit group $Y_3=Y_1 \cup Y_2$ have been inverted.

An aspect will now be discussed with reference to the following embodiments. A 1-bit error-correcting code C having 4 check bits ($c_1 c_2, c_3, c_4$), 6 data bits ($x_1, x_2, x_3, x_4, x_5, x_6$) and two constant binary values ($bf_1, bf_2$) and one H-matrix H is considered, wherein $$H = \begin{pmatrix} 1 & 0 & 0 & 0 & 1 & 1 & 0 & 0 & 1 & 0 & 1 & 1 \\ 0 & 1 & 0 & 0 & 1 & 0 & 0 & 1 & 0 & 1 & 1 & 1 \\ 0 & 0 & 1 & 0 & 0 & 1 & 1 & 0 & 0 & 1 & 1 & 0 \\ 0 & 0 & 0 & 1 & 0 & 0 & 1 & 1 & 1 & 0 & 0 & 1 \end{pmatrix} \quad (6)$$

and wherein the variables $c_1,c_2,c_3,c_4,bf_1,bf_2,x_1,x_2,x_3,x_4,x_5,x_6$ correspond to the columns of the H-matrix (6) H.

The number of ones of the third column and fourth column of the H-matrix is odd and $\bar{y}=\bar{y}_1, \ldots, \bar{y}_{16}$ is no codeword, if $y=y_1, \ldots, y_{12}=c_1, \ldots, c_4$, $bf_1, bf_2, x_1, \ldots, x_6$ is a codeword of the code C. It is defined that two subsets $Y_1$ and $Y_2$ of bits can be written directly or invertedly into the memory. Here, it is not necessary that $$\underbrace{1, \cdots, 1}_{12}$$

is a code vector of the code C.

The subset $Y_1$ may, e.g., be defined as $$Y_1=\{c_1,c_2,c_3,c_4,bf_1,x_1\}$$

and the subset $Y_2$ may, e.g., be defined as $$Y_2=\{c_3,c_4,bf_2,x_3,x_4,x_5,x_6\}.$$

The sets $Y_1$ and $Y_2$ are not disjunct, as they have the bits $c_3$ and $c_4$ in common.

The following applies: If $y=y_1, \ldots, y_{12}$ is a codeword of the code C, the word obtained from y by inverting the bits, which belong to $Y_1$, is also a codeword.

Likewise, the following applies: If $y=y_1, \ldots, y_{12}$ is a codeword of the code C, the word obtained from y by inverting the bits, which belong to $Y_2$, is also a codeword.

In the following, the case is considered that the codeword $y^*=1,0,1,1,1,1,1,0,1,0,1$ is to be stored directly or invertedly in the memory, e.g. at an address a. It is assumed that in a test, it has, for example, been determined that the $12^{th}$ bit $y^*_{12}$ has a stuck-at-0 error. Then, instead of the codeword $$y^*=1,0,1,1,1,1,1,1,0,1,0,1=c_1,c_2,c_3,c_4,bf_1,bf_2,x_1,x_2,x_3,x_4,x_5,x_6$$

the codeword $$c_1,c_2,\overline{c_3},c_4,bf_1,\overline{bf_2},x_1,\overline{x_2},\overline{x_3},\overline{x_4},\overline{x_5},\overline{x_6}=1,0,0,1,0,1,0,1,0,1,0=d_1,\ldots,d_{12}$$

can be stored into the memory, which is inverted in the bits of the subset $Y_2$, and whose value in the $12^{th}$ bit is equal to 0. By this, the stuck-at-0 error in this bit position has no effect.

If no further error occurs, the word $d_1', \ldots, d_{12}'=100010101010$ will be read out when reading at the address a. Since $d_1', \ldots, d_{12}'$ is a codeword of the code C, $d_1^{cor}, \ldots, d_{12}^{cor} = d_1', \ldots, d_{12}'$ and the value of $d_5^{cor}, d_6^{cor}=1,0$ indicates that the bits of the subset $Y_2$ have been inverted, so that $$y_1^{cor}, \ldots, y_{12}^{cor} = d_1^{cor}, d_2^{cor}, \overline{d_3^{cor}}, \overline{d_4^{cor}}, d_5^{cor}, \overline{d_6^{cor}}, \overline{d_7^{cor}}, \overline{d_8^{cor}}, \overline{d_9^{cor}}, \overline{d_{10}^{cor}}, \overline{d_{11}^{cor}}, \overline{d_{12}^{cor}}$$
$$= 101111110101$$

applies. By writing the bits, which are inverted in the bits of subset $Y_2$, into the memory and by reversing the performed inversion based on the constant binary values, the (stuck-at-0) error can be tolerated without having an effect.

Here, it is possible that, as has already been mentioned, an error has been detected by a test.

According to an embodiment, a codeword $y_1, \ldots, y_Q$ is directly written into a memory, and subsequently, the respective value is readout and compared with the written value to determine whether and where which errors occurred.

If an error detector exists, one can proceed as follows:

If the error detector does not indicate an error after writing a codeword $y_1, \ldots, y_Q$ at an address a when reading out at the address a, no new word will be written at the address a. If the error detector indicates an error, then the word, being inverted in the bits of $Y_1$ is written at the address a in the memory. If the error detector, when reading out at the address, does not indicate an error now, no further word is written into the memory. If the error detector indicates an error when reading out the word stored at the address a, the word, being inverted in the bits of $Y_2$, is written into the memory. If the error detector does not indicate an error now when reading out at the address, no further word is written into the memory. This is continued until either no error is indicated during reading out or until no further subset $Y_K$ of inverted bits exists.

Furthermore, the following procedure is possible:

At the address a, a codeword $y_1, \ldots, y_Q$ or a codeword inverted in the bits of subset $Y_i$ is written into the memory, and this written word is maintained when the error detector indicates a number of errors when the number of errors is correctable by the code C.

It is also possible to maintain the bits written into the memory when the error detector indicates that a certain number of errors is not exceeded. If the code C is a 2-bit error correcting code, then the word written into the memory can be maintained when the error detector indicates a 1-bit error at the most, since then still a further, random error can be corrected.

For error treatment, it is advantageous when several different subsets $Y_1, \ldots, Y_k$ with $k>1$ exist, whose bits can each be written into the memory directly or invertedly, which allows good adaptation to different possible permanent errors.

In the following, further embodiments will be discussed.

A shortened Hamming code having 5 check bits $c_1, \ldots, c_5$ and 8 payload data bits $x_1, \ldots, x_8$ and a constant binary value $bf_1$ directly or invertedly stored at an address $a=a_1, \ldots, a_5$ in a memory will be considered as the code C. In such embodiments, address the bits $a_1, \ldots, a_5$, as are involved in the encoding.

The H-matrix H of the code is $$H = \begin{pmatrix} 1 & 0 & 0 & 0 & 0 & 1 & 1 & 1 & 1 & 0 & 1 & 0 & 1 & 0 & 1 & 0 & 1 & 0 & 1 \\ 0 & 1 & 0 & 0 & 0 & 1 & 1 & 1 & 0 & 1 & 1 & 0 & 0 & 1 & 0 & 1 & 0 & 1 & 1 \\ 0 & 0 & 1 & 0 & 0 & 1 & 1 & 0 & 1 & 1 & 0 & 1 & 1 & 0 & 0 & 1 & 0 & 1 & 1 \\ 0 & 0 & 0 & 1 & 0 & 1 & 0 & 1 & 1 & 1 & 0 & 1 & 0 & 1 & 1 & 0 & 0 & 1 & 1 \\ 0 & 0 & 0 & 0 & 1 & 0 & 1 & 1 & 1 & 1 & 0 & 1 & 0 & 1 & 0 & 1 & 1 & 0 & 1 \end{pmatrix}, \quad (7)$$

wherein the columns of the H-matrix are referred to as $h_1, \ldots, h_{14}$. The variables $c_1,c_2,c_3,c_4,c_5,bf_1,x_1,x_2,x_3,x_4,x_5,x_6,x_7,x_8,a_1,a_2,a_3,a_4,a_5$ correspond to the respective columns of the H-matrix (7), from left to right. The corresponding G-matrix G in its systematic form is $$G = (P_{14,5} I_{14}),$$

wherein $I_{14}$ is a 14-dimensional unit matrix and $P_{14,5}$ has the form $$P = \begin{pmatrix} 1 & 1 & 1 & 1 & 0 \\ 1 & 1 & 1 & 0 & 1 \\ 1 & 1 & 0 & 1 & 1 \\ 1 & 0 & 1 & 1 & 1 \\ 0 & 1 & 1 & 1 & 1 \\ 1 & 1 & 0 & 0 & 0 \\ 0 & 0 & 1 & 1 & 1 \\ 1 & 0 & 1 & 0 & 0 \\ 0 & 1 & 0 & 1 & 1 \\ 1 & 0 & 0 & 1 & 0 \\ 0 & 1 & 1 & 0 & 1 \\ 1 & 0 & 0 & 0 & 1 \\ 0 & 1 & 1 & 1 & 0 \\ 1 & 1 & 1 & 1 & 1 \end{pmatrix} \quad (8)$$

When writing into the memory, by employing the address bits $a_1, \ldots, a_5$ of the memory address at which data are written into the memory, a codeword of the code C is defined as $$(bf_1,x_1,x_2,\ldots,x_8,a_1,\ldots,a_5) \cdot G = c_1, \ldots, c_5, x_1, \ldots, x_8, a_1, \ldots, a_5 \quad (9)$$

wherein $$c_1 = bf_1 + x_1 + x_2 + x_3 + x_5 + x_7 + a_1 + a_3 + a_5$$

$$c_2 = bf_1 + x_1 + x_2 + x_3 + x_4 + x_5 + x_8 + a_2 + a_4 + a_5$$

$$c_3 = bf_1 + x_1 + x_3 + x_4 + x_6 + x_7 + a_2 + a_4 + a_5$$

$$c_4 = bf_1 + x_2 + x_3 + x_4 + x_6 + x_8 + a_1 + a_4 + a_5$$

$$c_5 = x_1 + x_2 + x_3 + x_4 + x_6 + x_8 + a_2 + a_3 + a_5$$

applies and wherein $a_1, \ldots, a_5$ is referred to as a write address.

A set $$Y_1 = \{c_1, c_2, c_3, c_4, c_5, bf_1, x_1, x_2, x_3, x_4, x_5, x_6, x_7, x_8\}$$

of bits is defined, so that the bits of this set can be written into the memory either directly or invertedly. $bf_1$ is set to a constant value $bf_1 = 1$.

If $$v = c_1, c_2, c_3, c_4, c_5, bf_1, x_1, x_2, x_3, x_4, x_5, x_6, x_7, x_8, a_1, a_2, a_3, a_4, a_5$$

is a codeword of the code C, then $$v = \overline{c}_1, \overline{c}_2, \overline{c}_3, \overline{c}_4, \overline{c}_5, \overline{bf}_1, \overline{x}_1, \overline{x}_2, \overline{x}_3, \overline{x}_4, \overline{x}_5, \overline{x}_6, \overline{x}_7, \overline{x}_8, a_1, a_2, a_3, a_4, a_5$$

is also a codeword of the code C.

At the address $a = a_1, \ldots, a_5$, the bits $$d_1 = c_1, d_2 = c_2, d_3 = c_3, d_4 = c_4, d_5 = c_5, d_6 = bf_1 = 1, d_7 = x_1,$$
$$d_8 = x_2, d_9 = x_3, d_{10} = x_4, d_{11} = x_5, d_{12} = x_6, d_{13} = x_7,$$
$$d_{14} = x_8$$

are written into the memory when the bits are stored directly, or at the address a, the bits $$d_1 = \overline{c}_1, d_2 = \overline{c}_2, d_3 = \overline{c}_3, d_4 = \overline{c}_4, d_5 = \overline{c}_5, d_6 = \overline{bf}_1 = 0, d_7 = \overline{x}_1, d_8 = \overline{x}_2, d_9 = \overline{x}_3, d_{10} = \overline{x}_4, d_{11} = \overline{x}_5, d_{12} = \overline{x}_6, d_{13} = \overline{x}_7, d_{14} = \overline{x}_8$$

are written into the memory.

Then, when reading from the memory at the read address a', when a=a' and no error exists, the bits $d'_i = d_i$ are read out for $i = 1, \ldots, 14$, and the bits $d'_1, \ldots, d'_{14}, a_1, \ldots, a_5$ form a codeword of the code C.

If an error exists in the bits $d'_1, \ldots, d'_{14}$, which can be corrected by the code C, the error of the word $d'_1, \ldots, d'_{14}, a_1, \ldots, a_5$ is corrected to $d_1^{cor}, \ldots, d_{14}^{cor}, a_1, \ldots, a_5$, and it is determined based on the value $d_6^{cor}$ whether the data have been written into the memory directly or invertedly. For example, if $d_6^{cor} = 1$, then the data have been written into the memory directly, and if $d_6^{cor} = 0$, then the data have been written into the memory invertedly. Errors in the address bits are not corrected. They are detected, when the errors are detectable by the code C.

If, for example, a 1-bit error exists in the address bit $a_1$, the associated error syndrome is $[1,0,0,1,0]^T$. Since none of the columns $h_1, \ldots, h_{14}$ of the H-matrix is equal to $[1,0,0,1,0]^T$, no correction of one of the bits $d'_1, \ldots, d'_{14}$ is performed, and the error is indicated as a non-correctable error. By this, it can, for example, be detected that the read address and the write address do not match, and differ by an error detectable by the code C.

Figure 5:
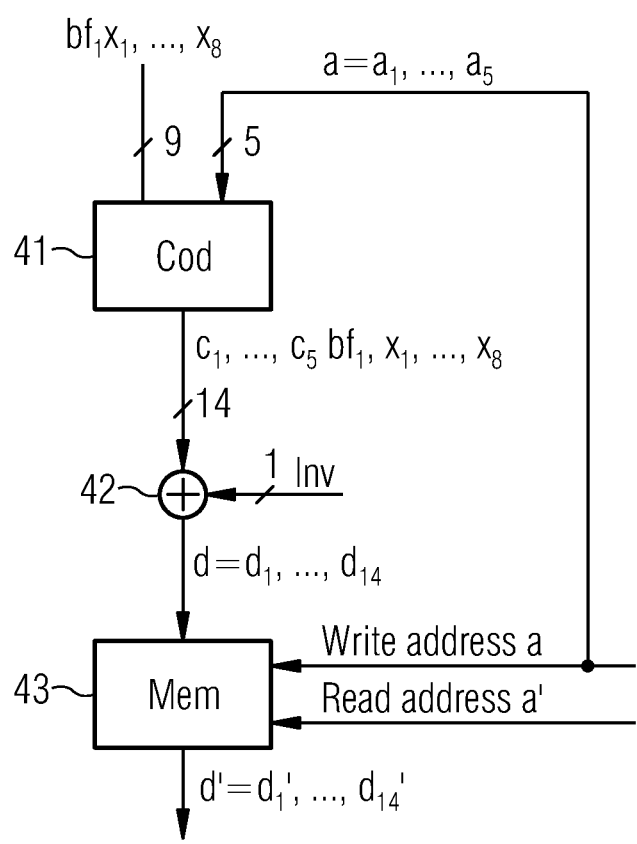
FIG. 5 illustrates an apparatus according to a still further embodiment.

FIG. 5 shows for an embodiment how the address bits $a = a_1, \ldots, a_5$ are involved in encoding the data to be stored. The circuit of FIG. 5 comprises a coder Cod 41 having a 9 bit-wide first input, a 5 bit-wide second input and a 14 bit-wide output. Moreover, the circuit of FIG. 5 comprises an inverting circuit 42 having a 14 bit-wide first input and a 1 bit-wide second input and a 14 bit-wide output. Furthermore, the circuit of FIG. 5 comprises an addressable memory Mem 43 having 14 data inputs, 14 data outputs and a 5 bit-wide address input for the write address and the read address.

For example, 8 payload data bits $x_1, \ldots, x_8$ are to be stored. The payload data bits are supplemented by a bit $bf_1$ carrying the constant binary value, wherein, here, the constant value is, e.g., $bf_1 = 1$.

The bits $bf_1, x_1, \ldots, x_8$ are applied to the 9 bit-wide first input of the coder Cod 41, while the bits $a_1, \ldots, a_5$ of the write address are applied to the 5 bit-wide second input of the coder Cod 41.

The coder Cod 41 is configured such that the coder Cod 41 outputs the bits $c_1, \ldots, c_5, bf_1 = 1, x_1, \ldots, x_8$ of the codeword $c_1, \ldots, c_5, bf_1 = 1, x_1, \ldots, x_8, a_1, \ldots, a_5$ at its 14 outputs, wherein the codeword is formed according to $$(c_1, \ldots, c_5, 1, x_1, \ldots, x_8, a_1, \ldots, a_5) = (1, x_1, \ldots, x_8, a_1, \ldots, a_5) \cdot G,$$

where G is the generator matrix of the considered code.

It is assumed that the code C is provided in its systematic form.

The 14 bit-wide output of the coder Cod 41 is guided into the first 14 bit-wide input of the XOR circuit 42 to whose second 1 bit-wide input an inversion signal Inv is applied.

The 14 bit-wide output of the XOR circuit 12 carrying the values $d_1, \ldots, d_4$ is connected to the 14 bit-wide data input of the memory Mem 43.

Here, the XOR circuit 42 comprises 14 XOR gates having two inputs and one output each, wherein a first input of these XOR gates is respectively connected to one of the 14 binary output lines of the coder Cod 41, while the second input of these XOR gates is respectively connected to the second input of the XOR circuit 42 carrying the inversion signal Inv.

For Inv=0, $d_1, \ldots, d_{14} = c_1, \ldots, c_5, 1, x_1, \ldots, x_8$ applies, while for Inv=1 $d_1, \ldots, d_{15} = \overline{c}_1, \ldots, \overline{c}_5, 0, \overline{x}_1, \ldots, \overline{x}_8$ applies, so that, depending on the inversion signal, bits output by the coder are written into the memory either directly, i.e. unamended, or invertedly.

Here, according to embodiments, the coder is implemented such that, when $$c_1, \ldots, c_5, 1, x_1, \ldots, x_8, a_1, \ldots, a_5$$

is a codeword of the code C, then $$\overline{c}_1, \ldots, \overline{c}_5, 0, \overline{x}_1, \ldots, \overline{x}_8, a_1, \ldots, a_5$$

is also a codeword of the code C.

In an embodiment, when writing data, the memory Mem 43 is provided with a write address a, so that the data applied to its data inputs are stored at the address $a = a_1, \ldots, a_5$. The bits $a_1, \ldots, a_5$ of the write address are part of the information bits $u_1, \ldots, u_{14} = bf_1, x_1, \ldots, x_8, a_1, \ldots, a_5$ of the code.

When reading data, data that are stored at a read address $a' = a'_1, \ldots, a'_5$ are read from the memory when a read address a' is applied.

If the write address a and the read address a' match, i.e. when a=a', the values $d'_1, \ldots, d'_{15}$ will be output at data outputs. It is possible that the data $d_1, \ldots, d_{15}$ written at an address a and the data $d'_1, \ldots, d'_{15}$ read out from the same address a, are different due to errors. If no error occurs, the read out value $d'_6$ indicates, whether the data have been written into the memory directly or invertedly. If an error correctable by the code occurs, then it can be detected depending on the data, being read out from the memory and corrected based on $d_6^{cor}$ whether the data have been written into the memory invertedly or directly, when the error is correctable by the code C.

Figure 6:
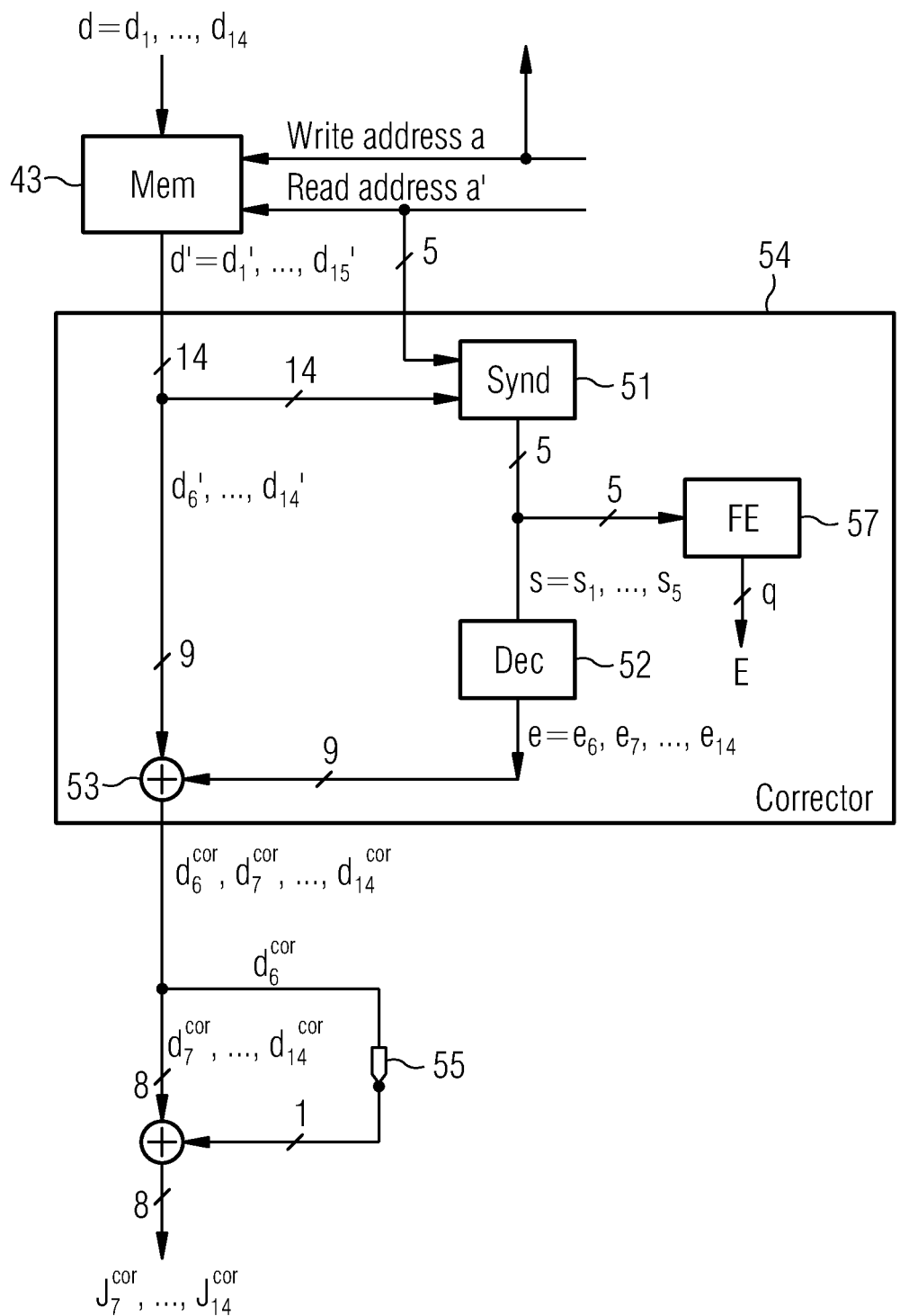
FIG. 6 illustrates an apparatus according to another further embodiment.

Supplementary to the apparatus of FIG. 5, FIG. 6 depicts an apparatus according to an embodiment for reading out possibly erroneous bits $d'_1, \ldots, d'_{14}$, for correcting erroneous bits and for inverting the bits, if the bits have been inverted prior to writing into the memory. The address bits $a_1, \ldots, a_5$ have been involved in forming a codeword of the code C, as already explained with reference to FIG. 5. The bits $d_1, \ldots, d_{14}$ are written into the memory Mem 43.

A read address a' is provided to the memory Mem 43, and the possibly erroneous bits $d'=d_1', \ldots, d_{14}'$ are read. The possibly erroneous bits $d'=d_1', \ldots, d_{14}'$ are output on 14 binary data outputs of the memory Mem 43. It may be assumed that a=a' applies and the bits written at the write address a are read out from the same address a'=a. Since the read-out bits d' can be erroneous, for example due to permanent or not permanent or transient memory errors, the read-out bits $d_1', \ldots, d_{14}'$ do not have to be equal to the written bits $d_1, \ldots, d_{14}$.

If no error exists, then $$(d',a')=d_1', \ldots, d_{14}', a_1', \ldots, a_5'$$

is a codeword of code C.

If (d',a') is no codeword of the code, then an error exists in the memory Mem 43 or an error has occurred when determining the address.

The bits $d_1', \ldots, d_{14}'$, being output on the data outputs of the memory 43, are simultaneously fed into a 14 bit-wide first input of a syndrome generator Synd 51 into whose 5 bit-wide second input, the bits $a_1', \ldots, a_5'$ of the read address a' are fed. The syndrome generator Synd 51 outputs a 5 bit-wide error syndrome $s=(s_1, \ldots, s_5)$ at its 5 bit-wide output. Here, the syndrome generator Synd 51 is configured such that the syndrome generator Synd 51 forms the error syndrome s according to $$s = H \cdot (d_1', \ldots, d_{14}', a_1', \ldots, a_5'),$$

wherein the H-matrix H of Formula (7) may, for example, be used. The read address a' is involved in syndrome formation.

The 5 bit-wide output of the syndrome generator Synd 51 is connected to a 5 bit-wide input of a decoder Dec 52 which may, for example, be implemented such that the syndrome generator Synd 51 forms a correction vector $e=(e_6, e_7, \ldots, e_{14})$ comprising the correction bits $e_6, e_7, \ldots, e_{14}$ for the bits $d_6', d_7', \ldots, d_{14}'$ being read out from the memory.

It is possible that the corrector also additionally forms correction signals $e_1, \ldots, e_5$, when the check bits are also to be corrected.

Furthermore, it is possible that the corrector also forms correction bits for the address bits $a_1', \ldots, a_5'$, wherein a correction signal different from 0 for the address bits indicates that an address error exists, and the bits read out at the erroneous address a' are not to be used further.

In FIG. 6, the XOR circuit 53 may, e.g., comprise 9 XOR gates $XOR_6, \ldots, XOR_{14}$, wherein each of the nine XOR gates has two inputs and one output (the nine individual XOR gates are not illustrated in FIG. 6). For i=6, . . . , 14, the value $d_i'$ is fed into the first input of the XOR gate $XOR_i$, and the value $e_i$ is fed into the second input, so that the value $$d_i^{cor} = d_i' + e_i$$

is output at the output of the i-th XOR gate $XOR_i$. The syndrome generator Synd 51, decoder Dec 52 and XOR circuit 53 may be considered as circuit parts which together form the corrector 54. The corrector 54 may also comprise an error detector FE 57, as shown in FIG. 6.

The least significant output of the XOR circuit 53, i.e. the output of the XOR gate $XOR_6$ carrying the value $d_6^{cor}$ is fed into the input of an inverter 55 that outputs the value $\overline{d}_6^{cor} = \overline{bf}_1^{cor}$ at its output. The 8 more significant outputs of the XOR circuit 53, i.e. the outputs of the XOR gates $XOR_7, \ldots, XOR_{14}$ carrying the values $d_7^{cor}, \ldots, d_{14}^{cor}$ are connected to a first 8 bit-wide input of an inverting circuit 54, in FIG. 6, comprising 8 XOR gates $XOR_7', \ldots, XOR_{14}'$ with two inputs and one output each, while the second 1 bit-wide input of the inverting circuit 54 is connected to the output of the inverter 55.

For i=7, . . . , 14 the value $d_i^{cor}$ is applied to the first input of the XOR gate $XOR_i'$, while the value $\overline{d}_6^{cor} = \overline{bf}_1^{cor}$, being output by the inverter 55, is fed into the second input. The XOR gate $XOR_i'$ outputs the value $y_i^{cor}$ at its output.

FIG. 6 shows that the bit positions where the constant binary value $bf_1$ and the payload data bits $x_1, \ldots, x_8$ are stored, are corrected.

It is also possible that further bits, for example also the check bits, are corrected, or that only a subset of the payload data bits is corrected.

In the embodiment shown in FIG. 6 an error detector FE 57 exists, whose 5 bit-wide input is connected to the output of the syndrome generator 51 and that outputs an error signal E at its q bit-wide output, wherein q≥1 applies.

It has been shown that, for embodiments, the bits $a_1, \ldots, a_r$ of the write address a and the bits $a_1', \ldots, a_r'$ of the read address with r=5 are involved in the encoding and decoding, so that the check bits are determined from the information bits, e.g., according to $$u_1, \ldots, u_{14} = bf_1, x_1, \ldots, x_8, a_1, \ldots, a_5.$$

It is also possible that bits are derived from the address bits $a_1, \ldots, a_r$ by a function $f: \{0,1\}^r \rightarrow \{0,1\}^t$ with t<r, wherein said derived bits $$A_1, \ldots, A_t = f(a_1, \ldots, a_r)$$

are determined so that $$u_1, \ldots, u_k = bf_1, \ldots, bf_1, x_1, \ldots, x_n, A_1, \ldots, A_t$$

form the information bits of the linear code C. Thus, it is, for example, possible that t=1, and $A_1$, being defined according to $$A_1 = a_1 + a_2 + \ldots + a_r.$$

is the parity of the address bits.

A further aspect of embodiments will now be discussed with respect to a BCH code.

An H-matrix of a (15,7) BCH code C, which can correct 1-bit and 2-bit errors, is (see Lin, S. and Costello, D. Error Control Coding, Prentice Hall, 1983, page 149) the H-matrix H $$H = \begin{pmatrix} 1 & 0 & 0 & 0 & 1 & 0 & 0 & 1 & 1 & 0 & 1 & 0 & 1 & 1 & 1 \\ 0 & 1 & 0 & 0 & 1 & 1 & 0 & 1 & 0 & 1 & 1 & 1 & 1 & 0 & 0 \\ 0 & 0 & 1 & 0 & 0 & 1 & 1 & 0 & 1 & 0 & 1 & 1 & 1 & 1 & 0 \\ 0 & 0 & 0 & 1 & 0 & 0 & 1 & 1 & 0 & 1 & 0 & 1 & 1 & 1 & 1 \\ 1 & 0 & 0 & 0 & 1 & 1 & 0 & 0 & 0 & 1 & 1 & 0 & 0 & 0 & 1 \\ 0 & 0 & 0 & 1 & 1 & 0 & 0 & 0 & 1 & 1 & 0 & 0 & 0 & 1 & 1 \\ 0 & 0 & 1 & 0 & 1 & 0 & 0 & 1 & 0 & 1 & 0 & 0 & 1 & 0 & 1 \\ 0 & 1 & 1 & 1 & 1 & 0 & 1 & 1 & 1 & 1 & 0 & 1 & 1 & 1 & 1 \end{pmatrix} \quad (10)$$

The variables $y_1, \ldots, y_{15}$ are allocated to the columns of the H-matrix from left to right.

Since each row of the H-matrix of this BCH code C comprises either 6, 8 or 12 ones, and hence, an even number of ones, $\underbrace{1, \ldots, 1}_{15}$ is a codeword of the code C, and it is possible to form a set $Y_1' = \{y_1, \ldots, y_{15}\}$ of all bits, that can either directly or invertedly be written into the memory as the bits $d_1, \ldots, d_{15}$. Since the H-matrix of Formula (10) has 8 rows, the BCH code has 8 check bits and 7 information bits. If $y_{15} = bf_1$ is selected as a constant value, 6 payload data bits can be stored. After reading out the possibly erroneous bits $d_1', \ldots, d_{15}'$ from the memory, 1-bit and 2-bit errors can be corrected by the BCH code. If, for example, $d_{15}'$ is erroneous, then $d_{15}'$ will be corrected to the correct value $d_{15}^{cor}$, even if a further bit is erroneous.

Embodiments may implement a further aspect that for identifying a set $Y_i$, of bits that are directly or invertedly written into the memory, t constant values $bf_1, \ldots, bf_t$ with t>1 are used. After the values $d_1', d_2', d_3', \ldots$, being read out from the memory, are corrected according to the error correcting code C, it can be decided from the corrected bits corresponding to the constant values $bf_1, \ldots, bf_t$, whether the bits of the bit group $Y_i$ are to be inverted or not. By this, the reliability of the statement, as to whether the bits of $Y_i$ are to be inverted or not, can be increased.

For example, t=3, and the code C may be a 2-bit error correcting code with a code distance 5. For the constant binary values $bf_{i1}, bf_{i2}, bf_{i3}$ of the subset $Y_i$ it can apply that $bf_{i1} = bf_{i2} = b_{i3} = 0$. In the case of a 1-bit error or a 2-bit error, it cannot happen, that not all bits $d_{i1}^{cor}, d_{i2}^{cor}, d_{i3}^{cor}$ at the bit positions at which the constant binary values have been stored directly or invertedly are the same, since all 1-bit and all 2-bit errors are corrected by the code C. Thereby, advantageously, the decision whether the bits of $Y_i$ have been written into the memory directly or invertedly is particularly reliable.

In the following, subsequent method steps of an embodiment are described, wherein the address bits are not involved in encoding:
1. Providing the data bits to be stored and supplementing the data bits by constant binary values.
2. Encoding the data bits and the constant binary values with an error correcting code C.
3. Forming the bits to be stored by the steps of
    determining, whether the bits of a subset of the bits to be stored are to be inverted
    inverting the bits of the subset when the bits of the subset of bits are to be inverted
    not inverting the bits of the subset when the bits of the subset of bits are not to be inverted
4. Writing the bits to be stored into a memory.
5. Reading the stored, possibly erroneous bits from the memory.
6. Correcting read, possibly erroneous bits by using the error correcting code C, wherein bit positions at which constant binary values have been stored and at least one bit position at which a data bit has been stored are to be corrected if occurring errors are correctable by the code C.
7. Inverting or not inverting values of stored bits, wherein it is decided based on corrected bits at the bit positions at which constant values have been stored, whether a subset of bits is to be inverted or not inverted.

In the following, subsequent method steps of a further embodiment are described, wherein the address bits are involved in encoding:

1. Providing the data bits to be stored and supplementing the data bits by constant binary values.
2. Encoding the data bits, the constant binary values and the address bits of the write address with an error correcting code C.
3. Forming the bits to be stored, wherein the address bits do not belong to the bits to be stored, by the steps of
    determining whether the bits of a subset of the bits to be stored are to be inverted
    inverting the bits of the subset when the bits of the subset of bits are to be inverted
    not inverting the bits of the subset when the bits of the subset of bits are not to be inverted
4. Writing the bits to be stored into a memory at the write address involved in the encoding.
5. Reading the stored, possibly erroneous bits from the memory at a read address.
6. Correcting read, possibly erroneous bits taking into account the read address by using the error correcting code C, wherein bit positions at which constant binary values have been stored and at least one bit position at which a data bit has been stored are to be corrected if occurring errors are correctable by the code C.
7. Inverting or not inverting values of stored bits, wherein it is decided based on corrected bits at the bit positions at which constant values have been stored, whether a subset of bits is to be inverted or not inverted.

In the following, embodiments are summarized:
According to an embodiment, a method for storing bits in a memory is provided, wherein the bits are encoded with a linear error correcting code C, the linear error correcting code C having a code distance which is at least 3, wherein it is determined whether a subset of the bits encoded with the linear error correcting code C is written into the memory directly or in a bit-by-bit inverted manner, and wherein the code C comprises an H-matrix H, wherein:

1. A subset of bits written into the memory either directly or invertedly comprises at least one binary constant value, which is together with payload data bits used for coding for forming a codeword of the linear code C, wherein the binary constant value is written as a binary value bf into the memory when the bits of the respective subset of bits are directly written into the memory, and wherein the binary value bf is written into the memory as inverted value $\overline{bf}$ when the bits of the respective subset of bits are invertedly written into the memory,
wherein a codeword of the code C is converted to a codeword of the same code when the subset of bits written into the memory either directly or invertedly is inverted and the H-matrix of the code is formed such that the number of ones of each component of the columns of the H-matrix corresponding to the subset of bits written into the memory either directly or invertedly, is even, 2. when reading out from the memory, possibly erroneous bits read out from the memory are corrected by using the linear error correcting code C, wherein at least that bit at the bit position at which the constant binary value bf has been written is corrected when the respective subset of bits has been written into the memory directly, or at the bit position at which the constant binary value $\overline{bf}$ has been written, when the respective subset of bits has been written into the memory invertedly, and 3. bits of the subset of bits that have been written into the memory directly or invertedly are inverted after reading out when the corrected value that has been read out at the bit position at which the constant value bf or the inverted constant value $\overline{bf}$ has been stored is equal to $\overline{bf}$, and not inverted, when this value is equal to bf.

According to an embodiment, the memory is a register.

According to another embodiment, the memory is a register array.

According to a further embodiment, the memory is an addressable memory.

In an embodiment, the bits encoded with an error correcting code C are encoded by using address bits.

According to an embodiment, the number of zeros or the number of ones in a subset of bits of the subset of bits that is written into the memory directly or invertedly determines whether the subset is written into the memory directly or invertedly.

In an embodiment, a subset of bits is written into the memory directly when, after direct writing, subsequent readout and comparison of the written values and the read-out values, no error has occurred.

According to an embodiment, a subset of bits is written into the memory directly when, after direct writing, subsequent readout and comparison of the written values and the read-out values, T errors have occurred at the most, wherein T is smaller than the number of errors that can be corrected by the code C.

In an embodiment, a subset of bits is written into the memory invertedly when, after inverted writing, subsequent readout and comparison of the written values and the read-out values, so many errors have occurred at the most as have occurred after direct writing and comparison of the read-out values and the written values.

According to an embodiment, a subset of bits is written into the memory invertedly when, after inverted writing, subsequent readout and comparison of the written values and the read-out values, T errors have occurred at the most, wherein T is smaller than the number of errors that can be corrected by the code C.

Moreover, according to another embodiment, a further method is provided. The method comprises:

1. Supplementing payload data bits $x_1, \ldots, x_n$ to be stored at an address a in an addressable memory by l bits $bf_1, \ldots, bf_l$ with constant values, wherein $l \geq 1$.
2. Encoding the bits with constant values $bf_1, \ldots, bf_l$ and the payload data bits $x_1, \ldots, x_n$ with a linear code C correcting at least 1-bit errors into a codeword $c_1, \ldots, c_m$, $bf_1, \ldots, bf_l, x_1, \ldots, x_n$, wherein $c_1, \ldots, c_m$ are check bits determined from $bf_1, \ldots, bf_l, x_1, \ldots, x_n$ when bits derived from the address bits are not involved in forming a codeword, and coding of bits $bf_1, \ldots, bf_l, x_1, \ldots, x_n, A_1, \ldots, A_k$ with a linear code C correcting at least 1-bit errors into a codeword $c_1, \ldots, c_m, bf_1, \ldots, bf_l, x_1, \ldots, x_n, A_1, \ldots, A_k$, wherein $c_1, \ldots, c_m$ are check bits determined from $bf_1, \ldots, bf_l, x_1, \ldots, x_n, A_1, \ldots, A_k$, when bits $A_1, \ldots, A_k$ derived from the address bits $a_1, \ldots, a_r$ are involved in encoding, and $A_1, \ldots, A_k = f(a_1, \ldots, a_r)$ are uniquely determined by a function $f: \{0,1\}^r \rightarrow \{0,1\}^k$ from the address bits.
3. Defining K groups $Y_1, \ldots, Y_k$ Of bits of the bits $c_1, \ldots, c_m, bf_1, \ldots, bf_l, x_1, \ldots, x_n$ to be stored directly or invertedly so that a subset of defined bits $bf_1, \ldots, bf_l$ is uniquely allocated to each of these groups, wherein $K \geq 1$,
4. Selecting which group of bits of groups $Y_1, \ldots, Y_k$ is stored into the memory in an inverted or non-inverter manner.
5. Writing the bits $c_1, \ldots, c_m, bf_1, \ldots, bf_l, x_1, \ldots, x_n$ into the memory at an address a, wherein bits belonging to a group of bits written into the memory invertedly are inverted prior to writing, and the bits not belonging to a group whose bits are inverted are written into the memory directly, i.e. in a non-inverted manner.
6. Reading out the bits stored in the memory at an address a.
7. Continuing at 8. if the bits derived from the address bits are not involved in forming the codeword and continuing at 10, if the bits derived from the address bits are involved in forming the codeword.
8. Correcting, based on the error correcting code C, bits read out from the memory possibly differing from values written to the same address due to an error, at least at the bit positions at which the constant values $bf_1, \ldots, bf_l$ have been stored directly or invertedly.
9. Continuing at 11.
10. Correcting, based on the error correcting code C, possibly erroneous values read out from the memory and by using possibly also erroneous bits $A_1', \ldots, A_k'$ derived from the possibly erroneous address bits at least at the bit positions at which the constant values $bf_1, \ldots, bf_l$ have been stored directly or invertedly.
11. Determining, from the read-out constant values corrected by using the code C uniquely allocated to the respective bit groups, whether and which bit group has been written into the memory directly or invertedly.
12. Inverting the read-out and corrected bits of the bit groups that have been determined in the previous step as the bit groups whose bits have been inverted during writing.
13. End of the method Furthermore, according to another embodiment, a method for directly or invertedly writing a subset of bits forming a codeword of a linear code C correcting at least 1-bit errors into a memory of memory cells directly or invertedly, and for reading and recovering the bits written into the memory from the bits read out possibly erroneously from the memory that were stored directly or invertedly, is provided, wherein the method comprises the steps:

1. Defining the number K of subsets of the bits encoded with a linear code C correcting at least 1-bit errors that can be written into the memory directly or invertedly, wherein $K \geq 1$.
2. Providing n payload data bits $x_1, \ldots, x_n$ that are to be stored as a subword of a codeword of a linear systematic code correcting at least 1-bit errors at an address $a = a_1, \ldots, a_r$ with $r \geq 2$.
3. Forming the information bits $u_1, \ldots, u_N$ of the code C, wherein then, if the address a is not involved in forming the codewords of the code C, the databits $x_1, \ldots, x_n$ are supplemented by l defined binary values $bf_1, \ldots, bf_l$, so that $$u_1, \ldots, u_N = bf_1, \ldots, bf_l, x_1, \ldots, x_n$$

with $N = l+n$ applies, and if the address a is involved in forming the codewords of the code C, the data bits $x_1, \ldots, x_n$ and bits $A_1, \ldots, A_k$ derived from address bits $a_1, \ldots, a_r$ are supplemented by l defined binary values $bf_1, \ldots, bf_l$, so that $$u_1, \ldots, u_N = bf_1, \ldots, bf_l, x_1, \ldots, x_n, A_1, \ldots, A_k,$$

with $N = l+n+k$ applies, wherein $$A_1, \ldots, A_k = f(a_1, \ldots, a_r)$$

are binary values uniquely determined by a function $f$ from the values of the r address bits $a_1, \ldots, a_r$, $l \geq 1$ and $1 \leq k \leq r$.
4. Continuing the method with step 5 if the address a is not involved in error detection or error correction and continuing the method with step 16 if the address is involved in error detection or error correction.

5. Forming a codeword $y_1, \ldots, y_P$ of the code C, wherein C is a linear systematic code with a generator matrix G in systematic form and an H-matrix H, wherein $$y = y_1, \ldots, y_P = (u_1, \ldots, u_N)G = c_1, \ldots, c_m, bf_1, \ldots, bf_l, x_1, \ldots, x_n,$$

applies and $c_1, \ldots, c_m$ are m are check bits, the generator matrix G is an (N,P)-matrix and the H-matrix $H = (h_1, \ldots, h_P)$ is an ([P−N],P)-matrix, so that all columns of the H-matrix are pairwise distinct and unequal to 0 and P=n+m+l, m=P−N, N=n+l and m=P−N applies.

6. Determining K subsets $Y_1 = \{y_{1,1}, \ldots, y_{1,q1}\}, \ldots, Y_K = \{y_{K,1}, \ldots, y_{K,qK}\}$ of bits $$y_1, \ldots, y_P = c_1, \ldots, c_m, bf_1, \ldots, bf_l, x_1, \ldots, x_n,$$

so that the following applies
  A bit or a plurality of the bits $bf_1, \ldots, bf_l$ with its first predefined values is one-to-one assigned to each subset $Y_1, \ldots, Y_k$.
  If $y_1^b, \ldots, y_P^b$ are binary values of the bits $y_1, \ldots, y_P$, then $y_1^b, \ldots, y_P^b$ is a codeword of the code C when for $j=1, \ldots, P$ and for every subset $Y_q$ with K≥q≥1, the following applies: $y_j^b = 1$ if $y_j$ is an element of the subset $Y_q$ and $y_j^b = 0$ if $y_j$ is not an element of the subset $Y_q$.

7. Defining which group of groups of bits $Y_1, \ldots, Y_k$ is written into the memory directly or invertedly.

8. Forming the P bits $d_1, \ldots, d_P$ to be written into the memory, wherein for $1, \ldots, P$ the following applies:
  $d_i = \overline{y_i}$ when $y_i$ belongs to a group whose bits are written into the memory invertedly.
  $d_i = y_i$ when $y_i$ does not belong to any group whose bits are written into the memory invertedly.

9. Writing the bits $d_1, \ldots, d_P$ into the memory at an address a.

Reading:

10. Creating an address a and reading out the possibly erroneous values $d'_1, \ldots, d'_P$ stored at the address a, which have originated from the values $d_1, \ldots, d_P$ written at the address a by possible errors.

11. Defining L bit positions $k_1, \ldots, k_L$ to be corrected by code C with L≤P and $\{k_1, \ldots, k_L\} \subseteq \{1, \ldots, P\}$, that are to be corrected by using the code C in the case of an erroneous value, wherein the bit positions at which $bf_1, \ldots, bf_l$ have been stored directly or invertedly belong to the bit positions to be corrected.

12. Determining binary correction values $e_{k_1}, \ldots, e_{k_L}$ of the defined L bit positions $k_1, \ldots, k_L$ to be corrected based on the code C for errors correctable by the code C.

13. Forming corrected bits $$d_{k_i}^{cor} = d'_{ki} \, op \, e_{k_i}$$

at least at the bit positions at which values $bf_1, \ldots, bf_l$ have been stored directly or invertedly, wherein op is a uniquely invertible Boolean operation.

14. Determining, based on the known inserted values $bf_1, \ldots, bf_l$ and the respective read-out values corrected by using the code C, for which group $Y_1, \ldots, Y_k$ the bits have been stored directly or invertedly.

15. Outputting the bits $$y_{k_i}^{cor} = d'_{ki} \, op \, e_{k_i}$$

if $Y_{k_j}$ belongs to a group of bits whose bits have been written directly into the memory and outputting the bits.

$$y_{k_i}^{cor} = \overline{d'_{ki} \, op \, e_{k_i}}$$

if $y_{k_i}$ belongs to a group of bits that have been written into the memory invertedly during writing into the memory, wherein "op" is a two-ary uniquely invertible Boolean operation and end of the method.

16. Forming a codeword $y = y_1, \ldots, y_P$ of the code C, wherein C is a linear systematic code with a generator matrix G in systematic form and an H-matrix H, wherein $$y = y_1, \cdots, y_P$$
$$= (u_1, \cdots, u_N) \cdot G$$
$$= = c_1, \cdots, c_m, bf_1, \cdots, bf_l, x_1, \cdots, x_n, A_1, \cdots, A_k$$

applies, the generator matrix G is an (N,P)-matrix and the H-matrix $H = (h_1, \ldots, h_P)$ is an ([P−N],P)-matrix, so that all columns of the H-matrix are pairwise distinct and unequal to 0 and P=n+l+m+k, N=n+l+k and $c_1, \ldots, c_m$ are m=P−N check bits.

17. Determining K subsets $Y_1 = \{y_{1,1}, \ldots, y_{1,q1}\}, \ldots, Y_K = \{y_{K,1}, \ldots, y_{K,qK}\}$ of the bits $$y_1, \ldots, y_{n+l+m} = c_1, \ldots, c_m, bf_1, \ldots, bf_l, x_1, \ldots, x_n,$$

so that the following applies
  A bit or a plurality of the bits $bf_1, \ldots, bf_l$ with its first predefined values is one-to-one assigned to each subset $Y_1, \ldots, Y_k$.
  If $y_1^b, \ldots, y_P^b$ are binary values of the bits $y_1, \ldots, y_P$, then $y_1^b, \ldots, y_P^b$ is a codeword of the code C when for $j=1, \ldots, P$ and for every subset $Y_q$ with K≥q≥1, the following applies: $y_j^b = 1$ if $y_j^b$ is an element of the subset $Y_q$ and $y_j^b = 0$ if $y_j^b$ is not an element of the subset $Y_q$.

18. Defining which group of bits $Y_1, \ldots, Y_k$ are written into the memory directly or invertedly.

19. Forming the P−k bits $d_1, \ldots, d_{m+l+n}$ to be written into the memory, wherein for $i=1, \ldots, m+n+l$ the following applies:
  $d_i = y_i$ when $y_i$ belongs to a group whose bits are written into the memory directly,
  $d_i = \overline{y_i}$ when $y_i$ belongs to a group whose bits are written into the memory invertedly.

20. Writing the bits $d_1, \ldots, d_{m+n+l}$ at an address a into the memory.

Reading:

21. Creating an address a and reading out possibly erroneous values $d'_1, \ldots, d_{m+n+l}'$ stored at the address a, which have originated from values $d_1, \ldots, d_{n+m+l}$ written at the address a by possible errors.

22. Defining L bit positions $k_1, \ldots, k_L$ to be corrected by code C with L≤P−k and $\{k_1, \ldots, k_L\} \subseteq \{1, \ldots, n+m+l\}$, that are corrected by using the code C in the case of an erroneous value, wherein the bit positions at which $bf_1, \ldots, bf_l$ have been stored directly or invertedly belong to the bit positions to be corrected.

23. Determining binary correction values $e_{k_1}, \ldots, e_{k_L}$ of the defined L bit positions $k_1, \ldots, k_L$ for errors correctable by the code C.

24. Forming corrected bits $$d_{k_i}^{cor} = d'_{k_i} \, op \, e_{k_i}$$

at least at the bit positions at which the values $bf_1, \ldots, bf_l$ have been stored directly or invertedly, wherein "op" is a binary uniquely invertible operation.

25. Determining, based on the known values $bf_1, \ldots, bf_l$ and the corresponding values read out and corrected by using the code C, for which group of the bits $Y_1, \ldots, Y_k$ the bits have been stored directly or invertedly.

26. Outputting the bits $$y_{k_i}^{cor}=d'_{k_i}\text{op}e_{k_i}$$

if $y_{k_i}$ belongs to a group of bits whose bits have been written directly into the memory and outputting the bits $$y_{k_i}^{cor}=\overline{d'_{ki}\text{op}e_{k_i}}$$

if $y_{k_i}$ belongs to a group of bits that have been written into the memory invertedly during writing into the memory, wherein "op" is a two-ary uniquely invertible Boolean operation and end of the method.

According to an embodiment, the memory is a Flash memory.

According to another embodiment, the memory is an M-RAM.

According to a further embodiment, the memory is an R-RAM.

In an embodiment, the generator matrix of the code C in its systematic form serves for encoding.

According to another embodiment, the code C is a Hamming code or a shortened Hamming code.

In another embodiment, the code C is a Hsiao code or a shortened Hsiao code.

According to a further embodiment, the code C is a BCH code or a shortened BCH code.

In another embodiment, k=r and $(A_1, \ldots, A_k)=(a_1, \ldots, a_r)$ apply.

According to another embodiment, k=1 and $A_1=f(a_1, \ldots, a_r)=a_1+a_2+\ldots+a_r$ applies and $A_1$ is the parity of the address bits $a_1, \ldots, a_r$.

According to a first aspect, an apparatus comprises: a processing unit, and a memory, wherein the processing unit is configured to encode a plurality of bits to obtain a plurality of encoded bits by employing a linear error correcting code, wherein each of the plurality of encoded bits has a bit value, wherein the linear error correcting code has a code distance which is at least 3, and wherein the plurality of encoded bits forms a first codeword of the linear error correcting code, wherein the processing unit is configured to determine an inversion decision indicating whether a subset of the encoded bits shall be inverted or not depending on the subset of the encoded bits, wherein the subset of the encoded bits is determined such that the first codeword of the linear error correcting code is transformed into a second codeword of that code if all bits of the subset are inverted and wherein the subset comprises all encoded bits of the plurality of encoded bits or comprises at least three of the encoded bits of the plurality of encoded bits, and wherein an encoded bit of the subset of the encoded bits is an indication bit, wherein the bit value of the indication bit is equal to a first predefined bit value, wherein, when the inversion decision indicates that the subset of the encoded bits shall not be inverted, the processing unit is configured to store, as a stored word, bits of the first codeword into the memory, wherein the bits of the first codeword stored in the memory comprise the indication bit having the first predefined bit value, and wherein, when the inversion decision indicates that the subset of the encoded bits shall be inverted, the processing unit is configured to modify the first codeword of the linear error correcting code to obtain the second codeword of the linear error correcting code by inverting each encoded bit of the subset of the encoded bits by changing its bit value, and is configured to store as the stored word the second codeword into the memory, wherein the second codeword comprises the indication bit being inverted so that the bit value of the indication bit is equal to a second predefined bit value being different from the first predefined bit value.

According to a second aspect when referring back to the first aspect, the apparatus is a circuitry.

According to a third aspect when referring back to the first aspect, the subset of the encoded bits comprises all encoded bits of the plurality of encoded bits.

According to a fourth aspect when referring back to the first aspect, the subset of the encoded bits does not comprise all encoded bits of the plurality of encoded bits.

According to a fifth aspect when referring back to the first aspect, the first predefined value is a first constant binary value bf, wherein the second predefined value is a second constant binary value $\overline{bf}$, and wherein the processing unit is configured to read the stored word from the memory, and wherein the processing unit is configured to invert bits of the subset of bits that have been written into the memory directly or invertedly, after reading out the stored word, when a bit value that has been read out from a bit position in the memory, at which the indication bit has been stored, is equal to the second constant binary value $\overline{bf}$, and is configured to not invert, when the bit value that has been read out from the bit position in the memory, at which the indication bit has been stored, is equal to the first constant binary value bf.

According to a sixth aspect when referring back to the first aspect, the first predefined value is a first constant binary value bf, wherein the second predefined value is a second constant binary value $\overline{bf}$, and wherein the processing unit is configured to read out the stored word from the memory, wherein the processing unit is configured to correct one or more bits of the stored word, if the one or more bits are erroneous, by using the linear error correcting code, wherein at least a bit that has been stored at the bit position at which the indication bit has been written is corrected, if said bit is erroneous, and wherein, after reading out the stored word and after correcting the one or more bits, the processing unit is configured to invert bits of the subset of bits that have been written into the memory directly or invertedly, when a bit value that has been read out from a bit position in the memory, at which the indication bit has been stored, is equal to the second constant binary value $\overline{bf}$, and is configured to not invert, when the bit value that has been read out from the bit position in the memory, at which the indication bit has been stored, is equal to the first constant binary value bf.

According to a seventh aspect when referring back to the first aspect, the linear error correcting code comprises a parity check matrix H, and wherein the number of ones of each component of the columns of the parity check matrix H is even.

According to an eighth sixth aspect when referring back to the first aspect, the memory is a register, or a register array, or an addressable memory.

According to a ninth aspect when referring back to the first aspect, the memory is an addressable memory and wherein the processing unit is configured to encode the plurality of bits to obtain the plurality of encoded bits by employing the linear error correcting code, and by using address bits.

According to a tenth aspect when referring back to the first aspect, the processing unit is configured to determine the inversion decision depending on the number of zeros of the subset of the encoded bits or the number of ones of the subset of the encoded bits.

According to an eleventh aspect when referring back to the first aspect, when after writing write values into the memory, after subsequently reading out the write values from the memory to obtain read values, and after comparing the written write values and the read write values, no error has occurred, the processing unit is configured to determine the inversion decision so that the inversion decision indicates that the subset of the encoded bits shall not be inverted.

According to a twelfth aspect when referring back to the first aspect, when after writing write values into the memory, after subsequently reading out the write values from the memory to obtain read values, and after comparing the written write values and the read write values, a number of T errors have occurred at the most, wherein T is smaller than the number of errors that can be corrected by the linear error correcting code, the processing unit is configured to determine the inversion decision so that the inversion decision indicates that the subset of the encoded bits shall not be inverted.

According to a thirteenth aspect when referring back to the first aspect, when, after writing inverted write values of a subset of bits into the memory, after subsequently reading out the written inverted write values from the memory to obtain read values, and after comparing the written inverted write values and the read inverted write values, so many errors have occurred at the most as have occurred after direct writing and comparison of the read-out values and the written not inverted values, the processing unit is configured to determine the inversion decision so that the inversion decision indicates that the subset of the encoded bits shall be inverted.

According to a fourteenth aspect when referring back to the first aspect, when, after writing inverted write values of a subset of bits into the memory, after subsequently reading out the written inverted write values from the memory to obtain read inverted write values, and after comparing the written inverted write values and the read values, T errors have occurred at the most, wherein T is smaller than the number of errors that can be corrected by the linear error correcting code, the processing unit is configured to determine the inversion decision so that the inversion decision indicates that the subset of the encoded bits shall be inverted.

According to a fifteenth aspect when referring back to the first aspect, the memory is a Flash memory, the memory is a magnetic random access memory (M-RAM) or the memory is a resistive random access memory (R-RAM).

According to a sixteenth aspect when referring back to the first aspect, the linear error correcting code comprises a generator matrix, and the processing unit is configured to encode the plurality of bits by using the generator matrix in its systematic form for encoding.

According to a seventeenth aspect when referring back to the first aspect, the linear error correcting code is a Hamming code or a shortened Hamming code.

According to an eighteenth aspect when referring back to the first aspect, the linear error correcting code is a Hsiao code or a shortened Hsiao code.

According to a nineteenth aspect when referring back to the first aspect, the linear error correcting code is a BCH code or a shortened BCH code.

According to a twentieth aspect when referring back to the first aspect, the processing unit is configured to determine a further inversion decision indicating whether a further subset of the encoded bits shall be inverted or not depending on the further subset of the encoded bits.

According to a twenty-first aspect, an apparatus comprises: a processing unit and a memory, wherein the processing unit is configured to supplement payload-data bits $x_1, \ldots, x_n$ to be stored at an address a in the memory by 1 bits $bf_1, \ldots, bf_l$ with constant values, wherein $l \geq 1$, wherein the processing unit is configured to encode the bits with constant values $bf_1, \ldots, bf_l$ and the payload data bits $x_1, \ldots, x_n$ with a linear error correcting code C correcting at least 1-bit errors into a codeword $c_1, \ldots, c_m, bf_1, \ldots, bf_l, x_1, \ldots, x_n$, wherein $c_1, \ldots, c_m$ are check bits determined from $bf_1, \ldots, bf_l, x_1, \ldots, x_n$ when bits derived from the address bits are not included in forming a codeword, and coding of bits $bf_1, \ldots, bf_l, x_1, \ldots, x_n, A_1, \ldots, A_k$ with a linear error correcting code C correcting at least 1-bit errors into a codeword $c_1, \ldots, c_m, bf_1, \ldots, bf_l, x_1, \ldots, x_n, A_1, \ldots, A_k$, wherein $c_1, \ldots, c_m$ are check bits determined from $bf_1, \ldots, bf_l, x_1, \ldots, x_n, A_1, \ldots, A_k$, when bits $A_1, \ldots, A_k$ derived from the address bits $a_1, \ldots, a_r$ are involved in encoding, and $A_1, \ldots, A_k = f(a_1, \ldots, a_r)$ are uniquely determined by a function $f: \{0,1\}^r \rightarrow \{0,1\}^k$ from the address bits, wherein the processing unit is configured to define K groups $Y_1, \ldots, Y_K$ of bits of the bits $c_1, \ldots, c_m, bf_1, \ldots, bf_l, x_1, \ldots, x_n$ to be stored directly or invertedly so that a subset of defined bits $bf_1, \ldots, bf_l$ is uniquely assigned to each of these groups, wherein K>1, wherein the processing unit is configured to determine the groups of bits $Y_1, \ldots, Y_K$ such that a first codeword of the linear error correcting code C is transformed into a second codeword of the linear error correcting code C if all the bits of a group $Y_j$, j=1, ..., K, are inverted and wherein the processing unit is configured to select which group of bits of groups $Y_1, \ldots, Y_K$ is stored into the memory in an inverted or non-inverter manner, wherein the processing unit is configured to write the bits $c_1, \ldots, c_m, bf_1, \ldots, bf_l, x_1, \ldots, x_n$ into the memory at an address a, wherein bits belonging to a group of bits written into the memory invertedly are inverted prior to writing, and the bits not belonging to a group whose bits are inverted are written into the memory in a non-inverted manner, wherein the processing unit is configured to read out the bits stored in the memory at an address a, wherein, if the bits derived from the address bits are not involved in forming the codeword, the processing unit is configured to correct, based on the linear error correcting code C, bits read out from the memory possibly differing from values written to the same address due to an error, at least at the bit positions at which the constant values $bf_1, \ldots, bf_l$ have been stored directly or invertedly, wherein, if the bits derived from the address bits are involved in forming the codeword, the processing unit is configured to correct, based on the linear error correcting code C, possibly erroneous values read out from the memory and by using possibly also erroneous bits $A_1', \ldots, A_k'$ derived from the possibly erroneous address bits at least at the bit positions at which the constant values $bf_1, \ldots, bf_l$ have been stored directly or invertedly, wherein the processing unit is configured to determine from the read-out constant values corrected by using the linear error correcting code C uniquely assigned to the respective bit groups, whether and which bit group has been written into the memory directly or invertedly, and wherein the processing unit is configured to invert the read-out and corrected bits of the bit group that has been determined in the previous step as the bit groups whose bits have been inverted during writing.

According to a twenty-second aspect when referring back to the twenty-first aspect, k=r and $(A_1, \ldots, A_k) = (a_1, \ldots, a_r)$ apply.

According to a twenty-third aspect when referring back to the twenty-first aspect, k=1 and $A_1 = f(a_1, \ldots, a_r) = a_1 + a_2 + \ldots + a_r$ apply, and wherein $A_1$ is the parity of the address bits $a_1, \ldots, a_r$.

According to a twenty-fourth aspect, an apparatus for storing bits in a memory, wherein the bits are encoded with a linear error correcting code C, the linear error correcting code C having a code distance which is at least 3, wherein it is determined whether a subset of the bits encoded with the linear error correcting code C is written into the memory directly or in a bit-by-bit inverted manner, and wherein the linear error correcting code C comprises an H-matrix H, comprises: a processing unit and a memory, wherein a subset of bits written into the memory either directly or invertedly comprises at least one binary constant value, which is together with data bits used for coding for forming a codeword of the linear error correcting code C, wherein the processing unit is configured to write the binary constant value as a binary value bf into the memory when the bits of the respective subset of bits are directly written into the memory, and wherein the processing unit is configured to write the binary constant value into the memory as an inverted value $\overline{bf}$ when the bits of the respective subset of bits are invertedly written into the memory, wherein the processing unit is configured to convert a codeword of the linear error correcting code C to a codeword of the same code when the subset of bits written into the memory either directly or invertedly is inverted and the H-matrix of the linear error correcting code C is formed such that the number of ones of each component of the columns of the H-matrix corresponding to the subset of bits written into the memory either directly or invertedly, is even, wherein the processing unit is configured to correct, when reading out from the memory, possibly erroneous bits read out from the memory by using the linear error correcting code C, wherein at least that bit at the bit position at which the constant binary value bf has been written is corrected when the respective subset of bits has been written into the memory directly, or at the bit position at which the constant binary value $\overline{bf}$ has been written, when the respective subset of bits has been written into the memory invertedly, and wherein the processing unit is configured to invert bits of the subset of bits that have been written into the memory directly or invertedly after reading out when the corrected value that has been read out at the bit position at which the constant value bf or the inverted constant value $\overline{bf}$ has been stored is equal to $\overline{bf}$, and not inverted, when this value is equal to bf.

According to a twenty-fifth aspect, a method comprises: encoding using an encoder a plurality of bits to obtain a plurality of encoded bits by employing a linear error correcting code, wherein each of the plurality of encoded bits has a bit value, wherein the linear error correcting code has a code distance which is at least 3, and wherein the plurality of encoded bits forms a first codeword of the linear error correcting code, determining using a processing unit an inversion decision indicating whether a subset of the encoded bits shall be inverted or not depending on the subset of the encoded bits, wherein the subset of the encoded bits is determined such that the first codeword of the linear error correcting code is transformed into a second codeword of that code if all bits of the subset are inverted and wherein the subset comprises all encoded bits of the plurality of encoded bits or comprises at least three of the encoded bits of the plurality of encoded bits, and wherein an encoded bit of the subset of the encoded bits is an indication bit, wherein the bit value of the indication bit is equal to a first predefined bit value, when the inversion decision indicates that the subset of the encoded bits shall not be inverted, storing, as a stored word, bits of the first codeword into the memory, wherein the bits of the first codeword stored in the memory comprise the indication bit having the first predefined bit value, and when the inversion decision indicates that the subset of the encoded bits shall be inverted, modifying the first codeword of the linear error correcting code to obtain the second codeword of the linear error correcting code by inverting each encoded bit of the subset of the encoded bits by changing its bit value, and storing as the stored word the second codeword into the memory, wherein the second codeword comprises the indication bit being inverted so that the bit value of the indication bit is equal to a second predefined bit value being different from the first predefined bit value.

According to a twenty-sixth aspect, a method comprises: supplementing payload data bits $x_1, \ldots, x_n$ to be stored at an address a in an addressable memory by 1 bits $bf_1, \ldots, bf_l$ with constant values, wherein $l \geq 1$, encoding with an encoder the bits with constant values $bf_1, \ldots, bf_l$ and the payload data bits $x_1, \ldots, x_n$ with a linear error correcting code C correcting at least 1-bit errors into a codeword $c_1, \ldots, c_m, bf_1, \ldots, bf_l, x_1, \ldots, x_n$, wherein $c_1, \ldots, c_m$ are check bits determined from $bf_1, \ldots, bf_l, x_1, \ldots, x_n$ when bits derived from the address bits are not involved in forming a codeword, and coding of bits $bf_1, \ldots, bf_l, x_1, \ldots, x_n, A_1, \ldots, A_k$ with a linear error correcting code C correcting at least 1-bit errors into a codeword $c_1, \ldots, c_m, bf_1, \ldots, bf_l, x_1, \ldots, x_n, A_1, \ldots, A_k$, wherein $c_1, \ldots, c_m$ are check bits determined from $bf_1, \ldots, bf_l, x_1, \ldots, x_n, A_1, \ldots, A_k$, when bits $A_1, \ldots, A_k$ derived from the address bits $a_1, \ldots, a_r$ are involved in encoding, and $A_1, \ldots, A_k = f(a_1, \ldots, a_r)$ are clearly determined by a function $f: \{0,1\}^r \to \{0,1\}^k$ from the address bits, defining using a processing unit K groups $Y_1, \ldots, Y_k$ Of bits of the bits $c_1, \ldots, c_m, bf_1, \ldots, bf_l, x_1, \ldots, x_n$ to be stored directly or invertedly so that a subset of defined bits $bf_1, \ldots, bf_l$ is uniquely assigned to each of these groups, wherein K>1, and such that that a first codeword of the linear error correcting code C is transformed into a second codeword of the linear error correcting code C if the bits of a group of bits are inverted, selecting using a processing unit which group of bits of groups $Y_1, \ldots, Y_k$ is stored into the memory in an inverted or non-inverter manner, writing using a processing unit the bits $c_1, \ldots, c_m, bf_1, \ldots, bf_l, x_1, \ldots, x_n$ into the memory at an address a, wherein bits belonging to a group of bits written into the memory invertedly are inverted prior to writing, and the bits not belonging to a group whose bits are inverted are written into the memory directly, i.e. in a non-inverted manner, reading out using a processing unit the bits stored in the memory at an address a, continuing at h) if the bits derived from the address bits are not involved in forming the codeword and continuing at j) if the bits derived from the address bits are involved in forming the codeword, correcting using a processing unit, based on the linear error correcting code C, bits read out from the memory possibly differing from values written to the same address due to an error, at least at the bit positions at which the constant values $bf_1, \ldots, bf_l$ have been stored directly or invertedly, continuing at k), correcting using a processing unit, based on the linear error correcting code C, possibly erroneous values read out from the memory and by using possibly also erroneous bits $A_1', \ldots, A_k'$ derived from the possibly erroneous address bits at least at the bit positions at which the constant values $bf_1, \ldots, bf_l$ have been stored directly or invertedly, determining using a processing unit, from the read-out constant values corrected by using the linear error correcting code C uniquely allocated to the respective bit groups, whether and which bit group has been written into the memory directly or invertedly, and inverting using a processing unit the read-out and corrected bits of the bit groups that have been determined in the previous step as the bit groups whose bits have been inverted during writing.

According to a twenty-seventh aspect, a method for directly or invertedly writing a subset of bits forming a codeword of a linear error correcting code C correcting at least 1-bit errors into a memory of memory cells directly or invertedly, and for reading and recovering the bits written into the memory from the bits read out possibly erroneously from the memory that were stored directly or invertedly, comprises: defining using a processing unit the number K of subsets of the bits encoded with a linear error correcting code C correcting at least 1-bit errors that can be written into the memory directly or invertedly, wherein K≥1, providing using a processing unit n payload data bits $x_1, \ldots, x_n$ that are to be stored as a subword of a codeword of a linear systematic code correcting at least 1-bit errors at an address $a=a_1, \ldots, a_r$ with r>2, forming using a processing unit the information bits $u_1, \ldots, u_N$ of the linear error correcting code C, wherein then, if the address a is not involved in forming the codewords of the linear error correcting code C, the databits $x_1, \ldots, x_n$ are supplemented by l defined binary values $bf_1, \ldots, bf_l$, so that $u_1, \ldots, u_N = bf_1, \ldots, bf_l, x_1, \ldots, x_n$ with N=l+n applies, and if the address a is involved in forming the codewords of the linear error correcting code C, the data bits $x_1, \ldots, x_n$ and bits $A_1, \ldots, A_k$ derived from address bits $a_1, \ldots, a_r$ are supplemented by l defined binary values $bf_1, \ldots, bf_l$, so that $u_1, \ldots, u_N = bf_1, \ldots, bf_l, x_1, \ldots, x_n, A_1, \ldots, A_k$, with N=l+n+k applies, wherein $A_1, \ldots, A_k = f(a_1, \ldots, a_r)$ are binary values uniquely determined by a function $f$ from the values of the r address bits $a_1, \ldots, a_r$, l≥1 and 1≤k≤r, d) continuing the method with step e) if the address a is not involved in error detection or error correction and continuing the method with step p) if the address is involved in error detection or error correction, e) forming using a processing unit a codeword $y_1, \ldots, y_P$ of the linear error correcting code C, wherein C is a linear systematic code with a generator matrix G in systematic form and an H-matrix H, wherein $y=y_1, \ldots, y_P=(u_1, \ldots, u_N) \cdot G=c_1, \ldots, c_m, bf_1, \ldots, bf_l, x_1, \ldots, x_n$, applies and $c_1, \ldots, c_m$ are m are check bits, the generator matrix G is an (N,P)-matrix and the H-matrix $H=(h_1, \ldots, h_P)$ is an ([P-N],P)-matrix, so that all columns of the H-matrix are pairwise distinct and unequal to 0 and P=n+m+l, m=P-N, N=n+l and m=P-N applies, f) determining using a processing unit K subsets $Y_1=\{y_{1,1}, \ldots, y_{1,q1}\}, \ldots, Y_K=\{y_{K,1}, \ldots, y_{K,qK}\}$ of bits $y_1, \ldots, y_P=c_1, \ldots, c_m, bf_1, \ldots, bf_l, x_1, \ldots, x_n$, so that the following applies: a bit or a plurality of the bits $bf_1, \ldots, bf_l$ with its first predefined values is one-to-one assigned to each subset $Y_1, \ldots, Y_k$, if $y_1^b, \ldots, y_P^b$ are binary values of the bits $y_1^b, \ldots, y_P^b$ then $y^b, \ldots, y$ is a codeword of the linear error correcting code C when for j=1, ..., P and for every subset $Y_q$ with K≥q≥1, the following applies: $y_j^b=1$ if $y_j$ is an element of the subset $Y_q$ and $y_j^b=0$ if $y_j$ is not an element of the subset $Y_q$, g) defining using a processing unit which group of groups of bits $Y_1, \ldots, Y_k$ is written into the memory directly or invertedly, h) forming using a processing unit the P bits $d_1, \ldots, d_P$ to be written into the memory, wherein for 1, ..., P (Komma) the following applies: $d_i=\overline{y_i}$ when $y_i$ belongs to a group whose bits are written into the memory invertedly, $d_i=y_i$ when $y_i$ does not belong to any group whose bits are written into the memory invertedly, writing using a processing unit the bits $d_1, \ldots, d_P$ into the memory at an address a, reading: creating using a processing unit an address a and reading out the possibly erroneous values $d_1, \ldots, d_P$ stored at the address a, which have originated from the values $d_1, \ldots, d_P$ written at the address a by possible errors, defining using a processing unit L bit positions $k_1, \ldots, k_L$ to be corrected by the linear error correcting code C with L≤P and $\{k_1, \ldots, k_L\} \subseteq \{1, \ldots, P\}$, that are to be corrected by using the linear error correcting code C in the case of an erroneous value, wherein the bit positions at which $bf_1, \ldots, bf_l$ have been stored directly or invertedly belong to the bit positions to be corrected, determining using a processing unit binary correction values $e_{k_1}, \ldots, e_{k_L}$ of the defined L bit positions $k_1, \ldots, k_L$ to be corrected based on the linear error correcting code C for errors correctable by the linear error correcting code C, forming using a processing unit corrected bits $d_{k_i}^{cor}=d'_{k_i}$ op $e_{k_i}$ at least at the bit positions at which values $bf_1, \ldots, bf_l$ have been stored directly or invertedly, wherein op is a uniquely invertible Boolean operation, determining using a processing unit, based on the known inserted values $bf_1, \ldots, bf_l$ and the respective read-out values corrected by using the linear error correcting code C, for which group $Y_1, \ldots, Y_k$ the bits have been stored directly or invertedly, outputting the bits $y_{k_i}^{cor}=d'_{k_i}$ op $e_{k_i}$, if $Y_k$ belongs to a group of bits whose bits have been written directly into the memory and outputting the bits $y_{k_i}^{cor}=\overline{d'_{k_i} op e_{k_i}}$, if $y_{k_i}$ belongs to a group of bits that have been written into the memory invertedly during writing into the memory, wherein "op" is a two-ary uniquely invertible Boolean operation and end of the method, forming using a processing unit a codeword $y=y_1, \ldots, y_P$ of the linear error correcting code C, wherein C is a linear systematic code with a generator matrix G in systematic form and an H-matrix H, wherein $y=y_1, \ldots, y_P=(u_1, \ldots, u_N) \cdot G=c_1, \ldots, c_m, bf_1, \ldots, bf_l, x_1, \ldots, x_n, A_1, \ldots, A_k$ applies, the generator matrix G is an (N,P)-matrix and the H-matrix $H=(h_1, \ldots, h_P)$ is an ([P-N],P)-matrix, so that all columns of the H-matrix are pairwise distinct and unequal to 0 and P=n+l+m+k, N=n+l+k and $c_1, \ldots, c_m$ are m=P-N check bits, determining using a processing unit K subsets $Y_1=\{y_{1,1}, \ldots, y_{1,q1}\}, \ldots, Y_K=\{Y_{K,1}, \ldots, Y_{K,qK}\}$ of the bits $y_1, \ldots, y_{n+l+m}=c_1, \ldots, c_m, bf_1, \ldots, bf_l, x_1, \ldots, x_n$, so that the following applies: a bit or a plurality of the bits $bf_1, \ldots, bf_l$ with its first predefined values is one-to-one assigned to each subset $Y_1, \ldots, Y_k$, if $y_1^b, \ldots, y_P^b$ are binary values of the bits $y_1, \ldots, y_P$, then $y_1^b, \ldots, y_P^b$ is a codeword of the linear error correcting code C when for j=1, ..., P and for every subset $Y_q$ with K≥q≥1, the following applies: $y_j^b=1$ if $y_j^b$ is an element of the subset $Y_q$ and $y_j^b=0$ if $y_j^b$ is not an element of the subset $Y_q$, defining using a processing unit which group of bits $Y_1, \ldots, Y_k$ are written into the memory directly or invertedly, forming using a processing unit the P-k bits $d_1, \ldots, d_{m+l+n}$, to be written into the memory, wherein for i=1, ..., m+n+l the following applies: $d_i=y_i$ when $y_i$ belongs to a group whose bits are written into the memory directly, $d_i=\overline{y_i}$ when y; belongs to a group whose bits are written into the memory invertedly, writing using a processing unit the bits $d_1, \ldots, d_{m+n+l}$ at an address a into the memory, reading: creating using a processing unit an address a and reading out possibly erroneous values $d'_1, \ldots, d'_{m+n+l}$ stored at the address a, which have originated from values $d_1, \ldots, d_{n+m+l}$ written at the address a by possible errors, defining using a processing unit L bit positions $k_1, \ldots, k_L$ to be corrected by the linear error correcting code C with L≤P−k and $\{k_1, \ldots, k_L\} \subseteq \{1, \ldots, n+m+l\}$, that are corrected by using the linear error correcting code C in the case of an erroneous value, wherein the bit positions at which $bf_1, \ldots, bf_l$ have been stored directly or invertedly belong to the bit positions to be corrected, determining using a processing unit binary correction values $e_{k_1}, \ldots, e_{k_L}$ of the defined L bit positions $k_1, \ldots, k_L$ for errors correctable by the linear error correcting code C, forming using a processing unit corrected bits $d_{k_i}^{cor}=d'_{ki}$ op $e_{k_i}$ at least at the bit positions at which the values $bf_1, \ldots, bf_l$ have been stored directly or invertedly, wherein "op" is a binary uniquely invertible operation, determining using a processing unit, based on the known values $bf_1, \ldots, bf_j$ and the corresponding values read out and corrected by using the linear error correcting code C, for which group of the bits $Y_1, \ldots, Y_k$ the bits have been stored directly or invertedly, outputting the bits $Y_{k_i}^{cor} = d'_{k_i}$ Op $e_{k_i}$ if $y_{k_i}$ belongs to a group of bits whose bits have been written directly into the memory and outputting the bits $y_{k_i}^{cor} = \overline{d'_{k_i} \text{op} e_{k_i}}$ if $y_{k_i}$ belongs to a group of bits that have been written into the memory invertedly during writing into the memory, wherein "op" is a two-ary uniquely invertible Boolean operation and end of the method.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding unit or item or feature of a corresponding apparatus.

The inventive decomposed signal can be stored on a digital storage medium or can be transmitted on a transmission medium such as a wireless transmission medium or a wired transmission medium such as the Internet.

Depending on certain implementation requirements, embodiments of embodiments can be implemented in hardware or in software. The implementation can be performed using a digital storage medium, for example a floppy disk, a DVD, a CD, a ROM, a PROM, an EPROM, an EEPROM or a FLASH memory, having electronically readable control signals stored thereon, which cooperate (or are capable of cooperating) with a programmable computer system such that the respective method is performed.

Some embodiments according to embodiments comprise a non-transitory data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are performed by any hardware apparatus.

While this disclosure has been described in terms of several advantageous embodiments, there are alterations, permutations, and equivalents which fall within the scope of this disclosure. It should also be noted that there are many alternative ways of implementing the methods and compositions of the present invention. It is therefore intended that the following appended claims be interpreted as including all such alterations, permutations, and equivalents as fall within the true spirit and scope of the present invention.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

Although each claim only refers back to one single claim, the disclosure also covers any conceivable combination of claims.

The invention claimed is:

1. An apparatus, comprising:
a processing unit, and
a memory,
wherein the processing unit is configured to encode a plurality of bits comprising data bits and an indication bit to obtain a plurality of encoded bits by employing a linear error correcting code, wherein each of the plurality of encoded bits has a bit value, wherein the linear error correcting code has a code distance which is at least 3, and wherein the plurality of encoded bits forms a first codeword of the linear error correcting code,
wherein the processing unit is configured to determine an inversion decision depending on memory faults of bit errors in the memory or depending on power consumption for storing data into the memory, wherein the inversion decision indicates whether a subset of the encoded bits shall be inverted or not depending on the subset of the encoded bits, wherein the subset comprises at least three of the encoded bits of the plurality of encoded bits, wherein the processing unit is configured to determine the bit value of the indication bit depending on the inversion decision,
wherein, when the inversion decision indicates that the subset of the encoded bits shall not be inverted, the processing unit is configured to store, as a stored word, bits of the first codeword into the memory, wherein the bits of the first codeword stored in the memory comprise the indication bit having a first predefined bit value, and
wherein, when the inversion decision indicates that the subset of the encoded bits shall be inverted, the processing unit is configured to modify the first codeword of the linear error correcting code to obtain a second codeword of the linear error correcting code by solely inverting each encoded bit of the subset of the encoded bits by changing its bit value, and is configured to store as the stored word bits of the second codeword into the memory, wherein the bits of the second codeword comprise the indication bit being inverted so that the indication bit has a second predefined bit value being different from the first predefined bit value.

2. An apparatus according to claim 1, wherein the apparatus is a circuitry.

3. An apparatus according to claim 1, wherein the subset of the encoded bits comprises all encoded bits of the plurality of encoded bits.

4. An apparatus according to claim 1, wherein the subset of the encoded bits does not comprise all encoded bits of the plurality of encoded bits.

5. An apparatus according to claim 1,
wherein the first predefined bit value is a first constant binary bit value bf,
wherein the second predefined bit value is a second constant binary bit value $\overline{bf}$, and
wherein the processing unit is configured to read the stored word from the memory, and
wherein the processing unit is configured to invert bits of the subset of bits that have been written into the memory directly or invertedly, after reading out the stored word, when a bit value that has been read out from a bit position in the memory, at which the indication bit has been stored, is equal to the second constant binary bit value $\overline{bf}$, and is configured to not invert, when the bit value that has been read out from the bit position in the memory, at which the indication bit has been stored, is equal to the first constant binary bit value bf.

6. An apparatus according to claim 1,
wherein the first predefined bit value is a first constant binary bit value bf,
wherein the second predefined bit value is a second constant binary bit value $\overline{bf}$, and
wherein the processing unit is configured to read out the stored word from the memory,
wherein the processing unit is configured to correct one or more bits of the stored word, if the one or more bits are erroneous, by using the linear error correcting code, wherein at least a bit that has been stored at the bit position at which the indication bit has been written is corrected, if said bit is erroneous, and
wherein, after reading out the stored word and after correcting the one or more bits, the processing unit is configured to invert bits of the subset of bits that have been written into the memory directly or invertedly, when a bit value that has been read out from a bit position in the memory, at which the indication bit has been stored, is equal to the second constant binary bit value $\overline{bf}$, and is configured to not invert, when the bit value that has been read out from the bit position in the memory, at which the indication bit has been stored, is equal to the first constant binary bit value bf.

7. An apparatus according to claim 6, wherein the linear error correcting code comprises a parity check matrix H, and wherein the number of ones of each component of the columns or rows of the parity check matrix H is even.

8. An apparatus according to claim 1, wherein the memory is a register, or a register array, or an addressable memory.

9. An apparatus according to claim 1, wherein the memory is an addressable memory and wherein the processing unit is configured to encode the plurality of bits to obtain the plurality of encoded bits by employing the linear error correcting code, and by using address bits for encoding or decoding.

10. An apparatus according to claim 1, wherein the processing unit is configured to determine the inversion decision depending on the number of zeros of the subset of the encoded bits or the number of ones of the subset of the encoded bits.

11. An apparatus according to claim 1, wherein, when after writing write values into the memory, after subsequently reading out the write values from the memory to obtain read values, and after comparing the written write values and the read write values, no error has occurred, the processing unit is configured to determine the inversion decision so that the inversion decision indicates that the subset of the encoded bits shall not be inverted.

12. An apparatus according to claim 1, wherein, when after writing write values into the memory, after subsequently reading out the write values from the memory to obtain read values, and after comparing the written write values and the read write values, a number of T errors have occurred at the most, wherein T is smaller than the number of errors that can be corrected by the linear error correcting code, the processing unit is configured to determine the inversion decision so that the inversion decision indicates that the subset of the encoded bits shall not be inverted.

13. An apparatus according to claim 1, wherein, when after writing inverted write values of a subset of bits into the memory, after subsequently reading out the written inverted write values from the memory to obtain read values, and after comparing the written inverted write values and the read inverted write values, so many errors have occurred at the most as have occurred after direct writing and comparison of the read-out values and the written not inverted values, the processing unit is configured to determine the inversion decision so that the inversion decision indicates that the subset of the encoded bits shall be inverted.

14. An apparatus according to claim 1, wherein, when, after writing inverted write values of a subset of bits into the memory, after subsequently reading out the written inverted write values from the memory to obtain read inverted write values, and after comparing the written inverted write values and the read values, T errors have occurred at the most, wherein T is smaller than the number of errors that can be corrected by the linear error correcting code, the processing unit is configured to determine the inversion decision so that the inversion decision indicates that the subset of the encoded bits shall be inverted.

15. An apparatus according to claim 1, wherein the memory is a Flash memory, wherein the memory is a magnetic random access memory (M-RAM) or wherein the memory is a resistive random access memory (R-RAM).

16. An apparatus according to claim 1,
wherein the linear error correcting code comprises a generator matrix, and
wherein the processing unit is configured to encode the plurality of bits by using the generator matrix in its systematic form for encoding.

17. An apparatus according to claim 1,
wherein the linear error correcting code is a Hamming code or a shortened Hamming code, or
wherein the linear error correcting code is a Hsiao code or a shortened Hsiao code, or
wherein the linear error correcting code is a BCH code or a shortened BCH code.

18. An apparatus according to claim 1, wherein the processing unit is configured to determine a further inversion decision indicating whether a further subset of the encoded bits shall be inverted or not depending on the further subset of the encoded bits.

19. An apparatus for storing bits in a memory, wherein the bits are encoded with a linear error correcting code C, the linear error correcting code C having a code distance which is at least 3, wherein it is determined, depending on memory faults of bit errors in a memory or depending on power consumption for storing data into the memory, whether a subset of the bits encoded with the linear error correcting code C is written into the memory directly or in a bit-by-bit inverted manner, and wherein the linear error correcting code C comprises an H-matrix H, wherein the apparatus comprises, a processing unit, and the memory, wherein a subset of bits written into the memory either directly or invertedly comprises at least one binary constant value, which is together with data bits used for coding for forming a codeword of the linear error correcting code C, wherein the processing unit is configured to write the binary constant value as a binary value bf into the memory when the bits of the respective subset of bits are directly written into the memory, and wherein the processing unit is configured to write the binary constant value into the memory as an inverted value $\overline{bf}$ by solely inverting the bits of the respective subset of bits written into the memory, wherein the processing unit is configured to convert a codeword of the linear error correcting code C to a codeword of the same code when the subset of bits written into the memory either directly or invertedly is inverted and the H-matrix of the linear error correcting code C is formed such that the number of ones of each component of the columns of the H-matrix corresponding to the subset of bits written into the memory either directly or invertedly, is even, wherein the processing unit is configured to correct, when reading out from the memory, possibly erroneous bits read out from the memory by using the linear error correcting code C, wherein at least that bit at the bit position at which the constant binary value bf has been written is corrected when the respective subset of bits has been written into the memory directly, or at the bit position at which the constant binary value $\overline{bf}$ has been written, when the respective subset of bits has been written into the memory invertedly, and wherein the processing unit is configured to invert bits of the subset of bits that have been written into the memory directly or invertedly after reading out when the corrected value that has been read out at the bit position at which the constant value bf or the inverted constant value $\overline{bf}$ has been stored is equal to $\overline{bf}$, and not inverted, when this value is equal to bf.

20. A method, comprising:

encoding using an encoder a plurality of bits comprising data bits and an indication bit to obtain a plurality of encoded bits by employing a linear error correcting code, wherein each of the plurality of encoded bits has a bit value, wherein the linear error correcting code has a code distance which is at least 3, and wherein the plurality of encoded bits forms a first codeword of the linear error correcting code, determining using a processing unit an inversion decision depending on memory faults of bit errors in the memory or depending on power consumption for storing data into the memory, wherein the inversion decision indicates whether a subset of the encoded bits shall be inverted or not depending on the subset of the encoded bits, wherein the subset comprises at least three of the encoded bits of the plurality of encoded bits, wherein the bit value of the indication bit is determined depending on the inversion decision, when the inversion decision indicates that the subset of the encoded bits shall not be inverted, storing, as a stored word, bits of the first codeword into the memory, wherein the bits of the first codeword stored in the memory comprise the indication bit having a first predefined bit value, and when the inversion decision indicates that the subset of the encoded bits shall be inverted, modifying the first codeword of the linear error correcting code to obtain a second codeword of the linear error correcting code by solely inverting each encoded bit of the subset of the encoded bits by changing its bit value, and storing as the stored word bits of the second codeword into the memory, wherein the bits of the second codeword comprise the indication bit being inverted so that the indication bit has a second predefined bit value being different from the first predefined bit value.

* * * * *